United States Patent
McGraw et al.

(10) Patent No.: US 12,484,429 B2
(45) Date of Patent: *Nov. 25, 2025

(54) ORGANIC VAPOR JET PRINTING SYSTEM

(71) Applicant: Universal Display Corporation, Ewing, NJ (US)

(72) Inventors: Gregory McGraw, Yardley, PA (US); William E. Quinn, Whitehouse Station, NJ (US); Gregg Kottas, Ewing, NJ (US); Matthew King, Moorestown, NJ (US); Benjamin Swedlove, Churchville, PA (US); Tomasz Trojacki, Keyport, NJ (US)

(73) Assignee: Universal Display Corporation, Ewing, NJ (US)

( * ) Notice: Subject to any disclaimer, the term of this patent is extended or adjusted under 35 U.S.C. 154(b) by 270 days.

This patent is subject to a terminal disclaimer.

(21) Appl. No.: 18/101,416

(22) Filed: Jan. 25, 2023

(65) Prior Publication Data

US 2023/0189626 A1    Jun. 15, 2023

Related U.S. Application Data

(63) Continuation of application No. 16/245,554, filed on Jan. 11, 2019, now Pat. No. 11,588,140.

(60) Provisional application No. 62/616,571, filed on Jan. 12, 2018.

(51) Int. Cl.
C23C 16/455 (2006.01)
C23C 16/44 (2006.01)
H10K 71/13 (2023.01)

(52) U.S. Cl.
CPC ......... *H10K 71/13* (2023.02); *C23C 16/4412* (2013.01); *C23C 16/4551* (2013.01); *C23C 16/45563* (2013.01)

(58) Field of Classification Search
None
See application file for complete search history.

(56) References Cited

U.S. PATENT DOCUMENTS

| 4,446,815 A | 5/1984 | Kalbskopf |
| 4,769,292 A | 9/1988 | Tang |
| 5,247,190 A | 9/1993 | Friend |
| 5,487,784 A | 1/1996 | Ellis, Jr. |

(Continued)

FOREIGN PATENT DOCUMENTS

| WO | 2008057394 A1 | 5/2008 |
| WO | 2010011390 A2 | 1/2010 |
| WO | 2014197396 A1 | 12/2014 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Binu Thomas
(74) *Attorney, Agent, or Firm* — Butzel Long

(57) ABSTRACT

Devices for deposition of material via organic vapor jet printing (OVJP) and similar techniques are provided. The depositor includes delivery channels ending in delivery apertures, where the delivery channels are flared as they approach the delivery apertures, and/or have a trapezoidal shape. The depositors are suitable for fabricating OLEDs and OLED components and similar devices.

17 Claims, 22 Drawing Sheets

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 2003/0230980 A1 | 12/2003 | Forrest |
| 2004/0174116 A1 | 9/2004 | Lu |
| 2008/0152806 A1* | 6/2008 | Forrest .............. C23C 16/45561 118/715 |
| 2009/0130858 A1 | 5/2009 | Levy |
| 2010/0247766 A1 | 9/2010 | Forrest |
| 2010/0310771 A1 | 12/2010 | Lee |
| 2012/0003396 A1* | 1/2012 | Maas ................ C23C 16/45551 427/595 |
| 2012/0207926 A1 | 8/2012 | Lee |
| 2014/0057390 A1* | 2/2014 | Mohan .................... C23C 14/04 257/E51.026 |
| 2015/0376787 A1* | 12/2015 | McGraw ................ C23C 14/04 118/724 |
| 2015/0380648 A1 | 12/2015 | McGraw |
| 2017/0101711 A1 | 4/2017 | McGraw |
| 2017/0229663 A1 | 8/2017 | Tsai |
| 2017/0294615 A1* | 10/2017 | van den Tillaart ..... C23C 14/12 |
| 2018/0163292 A1 | 6/2018 | Zhang |
| 2018/0323372 A1 | 11/2018 | Quinn |
| 2019/0218655 A1* | 7/2019 | McGraw ................ C23C 14/04 |
| 2019/0386216 A1* | 12/2019 | Quinn .................... B05B 12/18 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

W. M. Deen Analysis of Transport Phenomena OUP 1998 pp. 14-20.

William M. Deen, "Lubrication Approximation", Analysis of Transport Phenomea, published in 1998, pp. 270-281.

* cited by examiner

ORGANIC VAPOR JET PRINTING SYSTEM

CROSS-REFERENCE TO RELATED APPLICATIONS

This application is a continuation of U.S. application Ser. No. 16/245,554, filed Jan. 11, 2019, now U.S. Pat. No. 11,588,140, which is a non-provisional of, and claims the priority benefit of U.S. Patent Application Ser. No. 62/616,571, filed Jan. 12, 2018, the entire contents of each of which are incorporated herein by reference.

FIELD

The present invention relates to devices and techniques for depositing material for use in devices such as organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, a device for deposition of a material onto a substrate is provided, which includes a nozzle block having a first exhaust aperture; a second exhaust aperture; and a first delivery channel having a first end that forms a first delivery aperture disposed between the first exhaust aperture and the second exhaust aperture and closer to the first exhaust aperture than the second exhaust aperture, where the first delivery channel is wider at a first portion than at a second portion, the first portion being closer to the delivery aperture that the second portion, and the first portion is in direct fluid communication with the first delivery aperture and the second portion is in direct fluid communication with the first portion. That is, the delivery channel has a flare at the delivery aperture. The nozzle block may include a second delivery channel having a first end that forms a second delivery aperture disposed between the first exhaust aperture and the second exhaust aperture, where the second delivery aperture is offset from the first delivery aperture along an axis of the nozzle. The side wall of the delivery channel at the flare may form an angle in the range of 30-60° with the surface of the nozzle block. The first and second exhaust apertures may be rectangular, with the longest edge of each being arranged along a direction of relative movement of the device and the substrate when the device is in operation. The delivery aperture may have a flare width of 6-12 μm. The delivery aperture(s) may be rectangular, trapezoidal, or any other suitable shape. For a trapezoidal delivery aperture, an angle α between a long center axis of the delivery aperture and a longest edge of the delivery aperture may be in the range of 1.1°-1.7°. The nozzle block may further include third and fourth exhaust apertures and a second delivery channel having a first end that forms a first delivery aperture disposed between the third exhaust aperture and the fourth exhaust aperture and closer to the fourth exhaust aperture than the third exhaust aperture, with the second delivery channel being flared at the corresponding delivery aperture. The second delivery channel, third exhaust aperture, and fourth exhaust aperture may be disposed in a trailing position in the nozzle block relative to the first delivery channel, first exhaust aperture, and second exhaust aperture. The group of the first and second exhaust apertures may be offset from the group of the third and fourth delivery apertures along a direction perpendicular to the leading/trailing axis.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
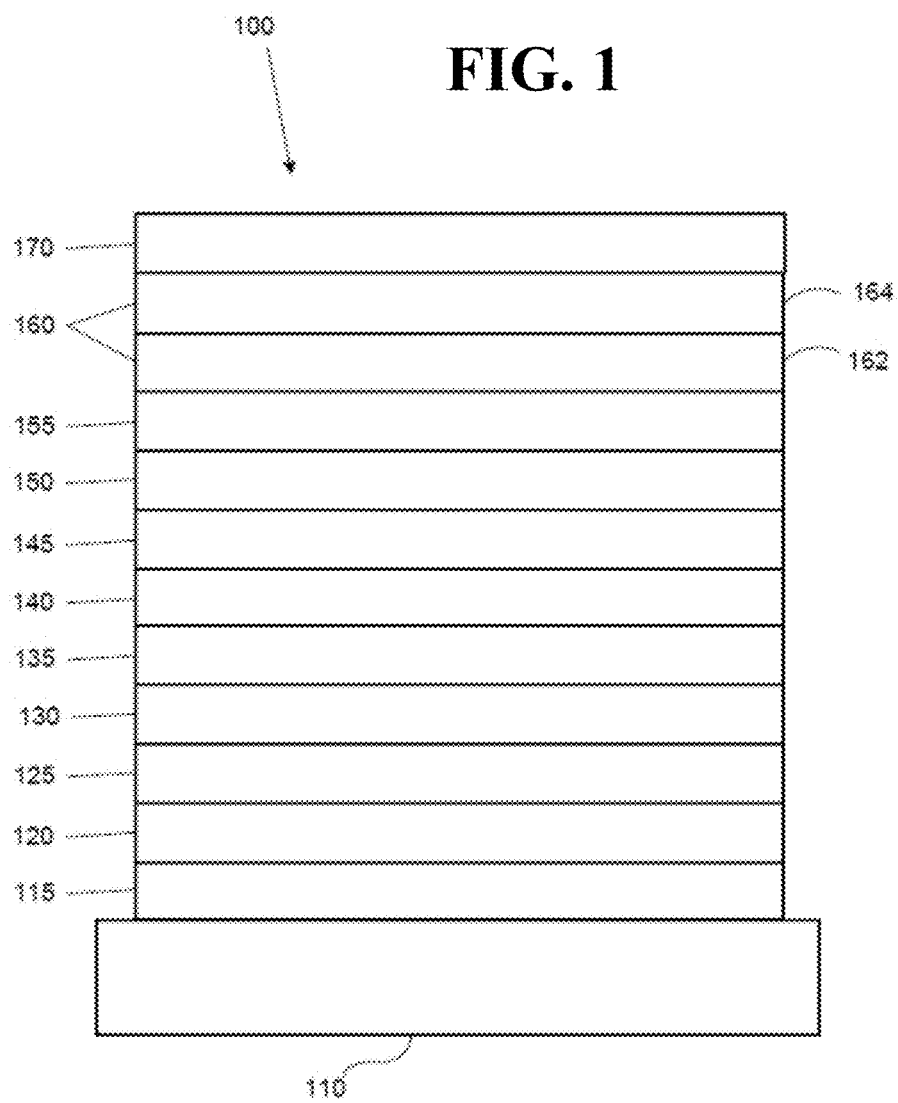
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
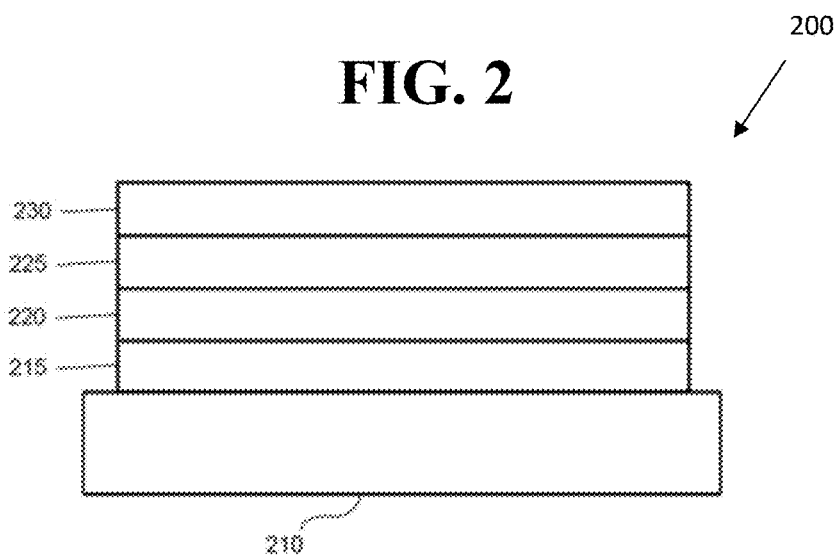
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

The various layers of OLEDs and similar devices disclosed herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Some OLEDs and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials, structures, and techniques described herein may have applications in devices other than the fabrication of OLEDs. For example, other optoelectronic devices such as organic solar cells and organic photodetectors may employ or be fabricated by the materials, structures, and techniques. More generally, organic devices, such as organic transistors, may employ the materials, structures, and techniques.

In some embodiments, an OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using the devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously described, various systems, devices and techniques may be used to fabricate OLEDs and devices containing OLEDs. One such technique is OVJP, in which material such as organic emissive material is directed in a jet ejected from a nozzle toward a substrate. Recent OVJP systems incorporate a delivery-exhaust-confinement (DEC) arrangement. For example, DEC-type arrangements disclosed in U.S. Patent Publication No. 2015/0376787, the disclosure of which is incorporated by reference in its entirety, use convection to confine deposition of the organic vapor into a desired printing zone. As another example, U.S. Patent Publication No. 2017/0294615, the disclosure of which is incorporated by reference in its entirety, describes DEC depositor having modified delivery apertures that may improve the thickness uniformity of printed thin film features over a central region of interest. For example, the delivery aperture of the depositor may be split into two offset sections.

Embodiments disclosed herein provide OVJP depositors that print thin film features that are highly uniform in thickness over the active area of printed devices. The OVJP depositors disclosed herein may differ from conventional OVJP nozzles in that, for example, the delivery aperture sidewall is arranged to act as a semi-diverging nozzle. Furthermore, devices disclosed herein may incorporate trapezoidal delivery apertures and/or pairs of mirror-image depositors that are arranged in offset ranks along the print direction. Depositors as disclosed herein may provide improved deposition rates and/or process stability relative to conventional OVJP deposition systems.

Figure 3A:
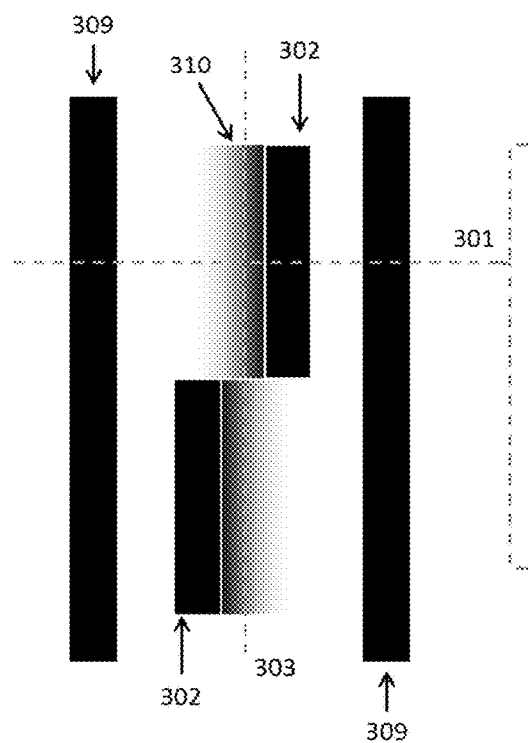
FIGS. 3A and 3B show an OVJP depositor with a diverging delivery aperture as seen from the substrate and a cross sectional view of the internal channels of the depositor according to an embodiment disclosed herein.
Figure 3B:
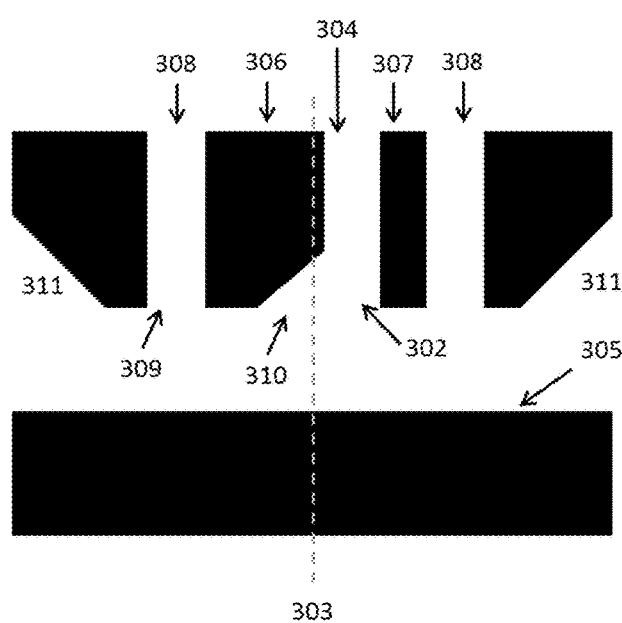

It has been found that the uniformity and deposition efficiency achieved in OVJP may be improved by flaring the inner sidewall of the delivery aperture of a split-depositor aperture to form a diverging delivery aperture. FIGS. 3A-3B show such a depositor according to an embodiment. FIG. 3A shows a surface of the depositor as viewed from the substrate. FIG. 3B shows a cross section of the depositor taken across the dashed line 301 through the facial section shown in FIG. 3A. The delivery apertures 302 are split and offset from each other along the centerline 303 of the depositor to increase the uniformity of organic thin film deposition over the printing target. A split depositor arrangement as shown in FIG. 3 is described in further detail in U.S. Patent Pub. No. 2017/0294615, the disclosure of which is incorporated by reference in its entirety. As shown in FIG. 3A, in some embodiments the delivery apertures 302 may be arranged between the exhaust apertures 309, such that a line drawn between and perpendicular to the two exhaust apertures crosses only one of the delivery apertures. This and other arrangements disclosed in U.S. Patent Pub. No. 2017/0294615 may be used with any of the various depositor arrangements and modifications disclosed herein.

The delivery aperture is in fluid communication with a delivery channel 304 that transports organic vapor entrained in an inert carrier gas from a sublimation source to a substrate 305 beneath the print head. The delivery channel is bounded in its cross section by two sides, a wide spacer 306 and a narrow spacer 307. The spacers separate the delivery channels from the exhaust channels 308. The exhaust channels terminate in exhaust apertures 309, and may connect the exhaust apertures 309 to a vacuum source. The junction between the delivery aperture and the delivery channel contains a diverging section 310, such that the sidewall flares outward relative to the delivery channel on the side of the wide spacer and the wide spacer tapers to become narrower at its tip. That is, the delivery channel 304 includes a diverging portion 310 that is wider than the portion that is farther from the delivery aperture 302 than the diverging portion 310. The different portions form a single delivery channel such that they are all in direct fluid communication in a channel leading through the depositor to the delivery aperture. The width and, more generally, the shape of the delivery aperture 302 may be the same as the width and shape of the diverging portion of the delivery channel 310, i.e., the delivery channel 310 may diverge at an end portion closest to the delivery aperture, ending in the delivery aperture itself. Crosswise channels formed by recesses in the depositor surfaces 311 may provide high conduction paths for confinement gas to ensure its even distribution along the length of the depositor.

Figure 4:
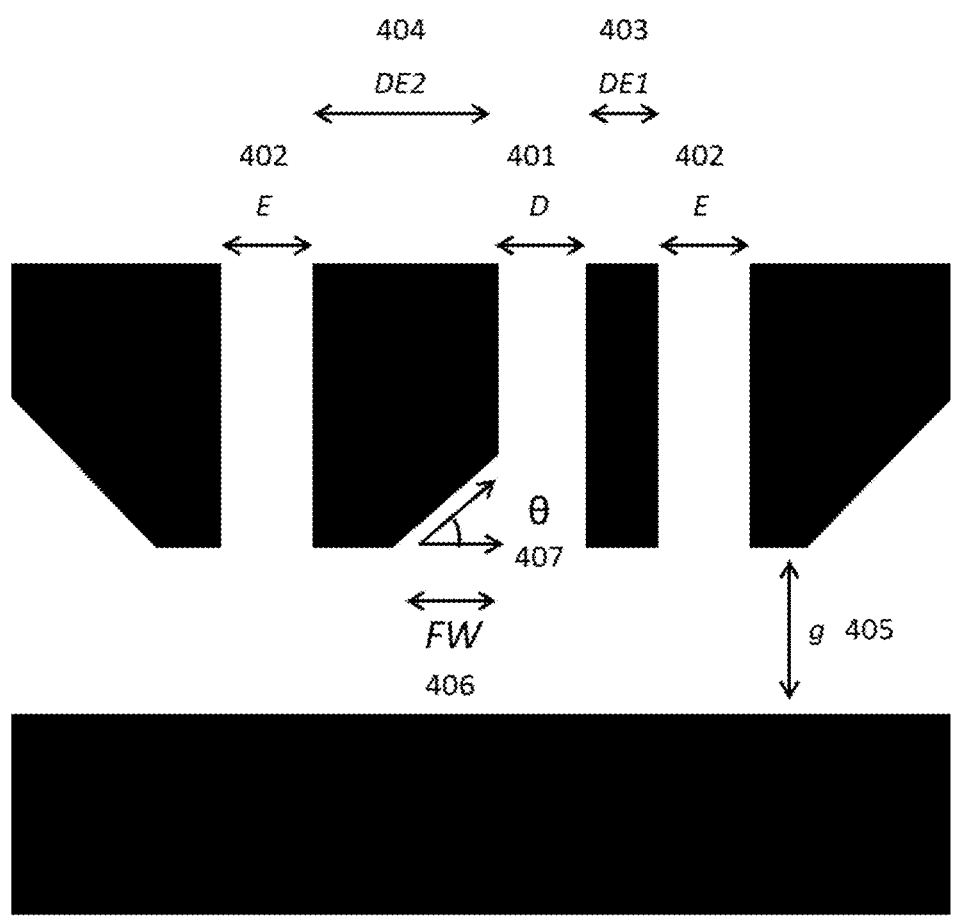
FIG. 4 shows an expanded cross sectional view of an OVJP depositor with a diverging delivery aperture as shown in FIGS. 3A-3B with example dimensions according to an embodiment disclosed herein.

FIG. 4 shows an expanded view of a depositor as shown in FIG. 3 to illustrate various portions and dimensions of the arrangement. The width of the delivery channel upstream of the divergence is D 401. The width of the exhaust channel is E 402. The widths of the narrow and wide spacers are DE1 403 and DE2 404, respectively. The fly height separation between the depositor and the substrate is g 405.

Figure 5:
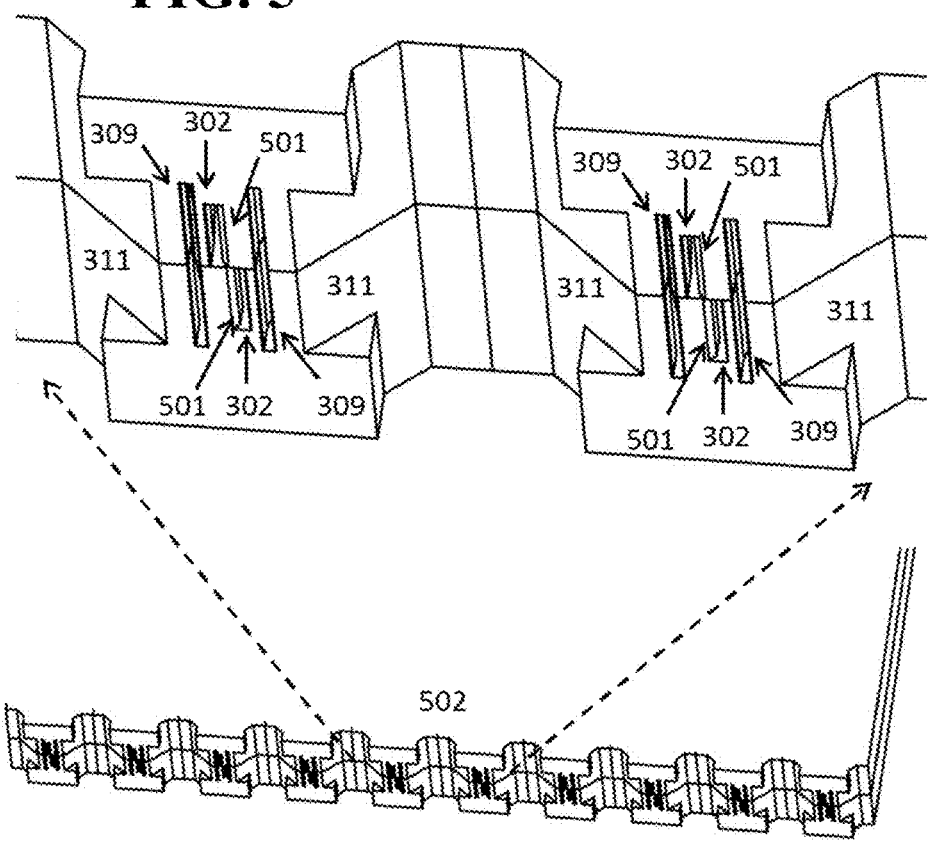
FIG. 5 shows a three dimensional rendering of an OVJP depositor with a diverging delivery aperture according to an embodiment disclosed herein.

The divergence of the delivery aperture may be characterized by the flare width FW 406 and the angle θ 407 of the upper bound of the angle with respect to the surface of the depositor facing the substrate, as shown. The flare angle θ (407) may be in the range 30-60° or, more generally, any angle that provides the desired width and flare width for the delivery channel and aperture, as disclosed in further detail herein. In general, smaller printed features may benefit from a higher flare angle, while for larger printed features a relatively smaller angle may be preferred. A three-dimensional rendering of the depositor is shown in FIG. 5. The flared wall 501 of the delivery channel is visible through the delivery apertures 302. In some embodiments, multiple depositors may be arranged in a microfabricated linear array 502 contained within a print head.

Figure 6:
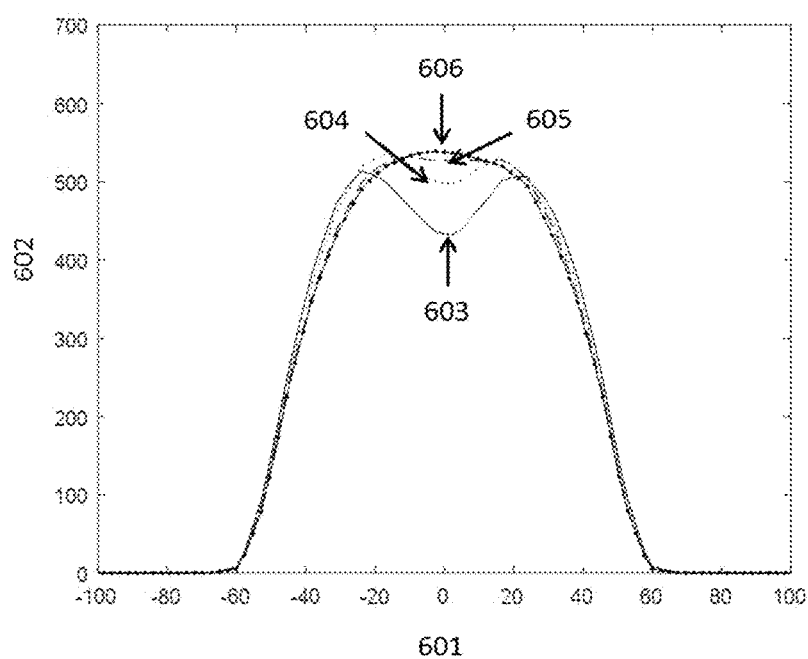
FIG. 6 shows deposition profiles generated by OVJP depositors with various degrees of delivery aperture divergence according to embodiments disclosed herein.

Examples cross-sectional deposition profiles generated on a substrate by depositors with varying degrees of divergence are shown in FIG. 6. The offset from the centerline of the deposited feature is indicated in microns by the horizontal axis 601 and the normalized thin film thickness is indicated by the vertical axis 602. Flare widths of FW=0 (603), 4 µm (604), 8 µm (605), and 12 µm (606) are shown. The feature profile generated by the FW=0 case, i.e., no flare, shows two pronounced peaks around a pronounced central depression. This may adversely affect the thickness uniformity of the feature. The depression becomes progressively smaller for the FW=4 µm and 8 µm cases, improving uniformity. The central depression is due to the offset between the two sections of the delivery aperture creating a region of low organic flux towards the centerline of the depositor. The divergence at the end of the delivery channel redirects more delivery gas and organic vapor flux towards the centerline, thereby evening the deposition profile as shown.

If the divergence is more pronounced, the center of feature may become convex, as it does for a flare width FW of 12 µm, and thickness uniformity will decrease. It has thus been found that, in this arrangement, the optimum degree of divergence to achieve a printed feature with acceptable thickness uniformity around the central portion of the deposited feature is between 8 and 12 µm. As described herein, the "uniformity" of a deposited feature is defined as one minus the difference between the maximum and minimum thicknesses within a specified width about the middle of the feature, normalized to the average thickness over this width. The uniformity over 50 µm ("U50"), generally is used as a performance metric for depositors. The U50 values for flare widths as previously disclosed are provided in Table 1:

TABLE 1

| FW (µm) | $U_{50}$ |
|---|---|
| 0 | 0.829 |
| 4 | 0.926 |

TABLE 1-continued

| FW (µm) | $U_{50}$ |
|---|---|
| 8 | 0.933 |
| 12 | 0.907 |

Figure 7A:
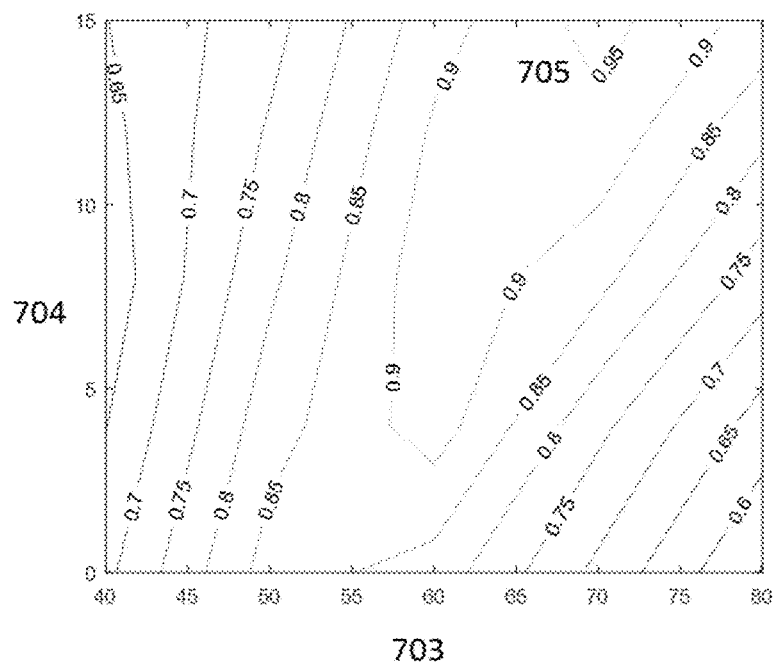
FIGS. 7A and 7B show contour plots of feature thickness uniformity generated by depositors with diverging delivery apertures for various depositor geometries according to embodiments disclosed herein.
Figure 7B:
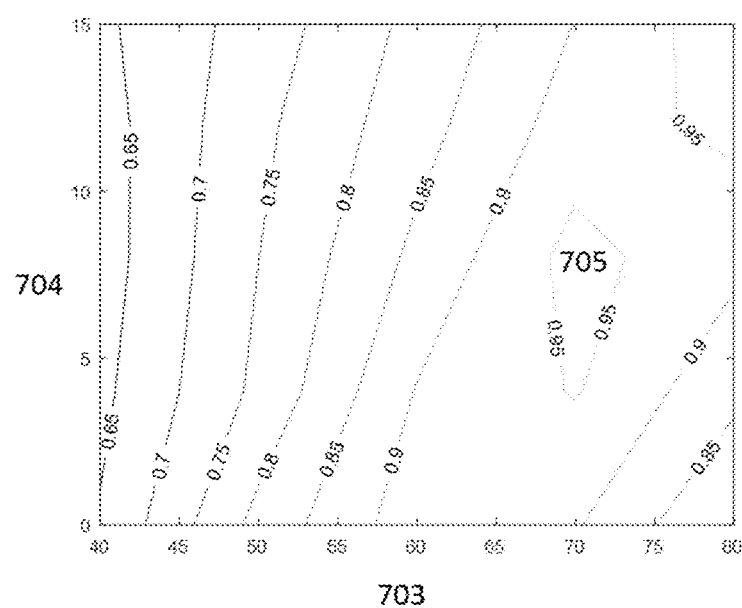

These U50 results would suggest that a flare width of 8 µm is optimal. More generally, in some embodiments flare widths in the range of 6-10 µm, 6-12 µm, 8-10 µm, or 8-12 µm may be preferred. However, the uniformity and deposition rates should be considered together to determine the full utility of diverging delivery apertures. FIGS. 7A and 7B show contour plots of the U50 attainable by different depositor designs at fly heights of g=30 µm and g=45 µm, respectively. The horizontal axis 703 indicates DE2 and the vertical axis 704 indicates FW, both measured in microns. As is evident from these examples, the width DE2 largely controls the uniformity of printed features. In some cases there may be an optimal value of DE2 to achieve the highest degree of uniformity as previously defined for a given fly height. However, the potentially optimal value is not always sufficient to achieve a desired uniformity level, particularly at lower fly heights. Adding divergence to the delivery aperture provides another method for improving uniformity. For example, if a U50 of 95% or more is desired at a given fly height, then it may be desirable for the depositor to occupy a region of the design space 705 enclosed by the 0.95 contour. This occupies the upper right portion of the graph in both cases, and so indicates a diverging delivery aperture with FW greater than 0. Operating the depositor at a lower fly height generally reduces the window of acceptable designs while increasing the amount of divergence required.

Figure 8A:
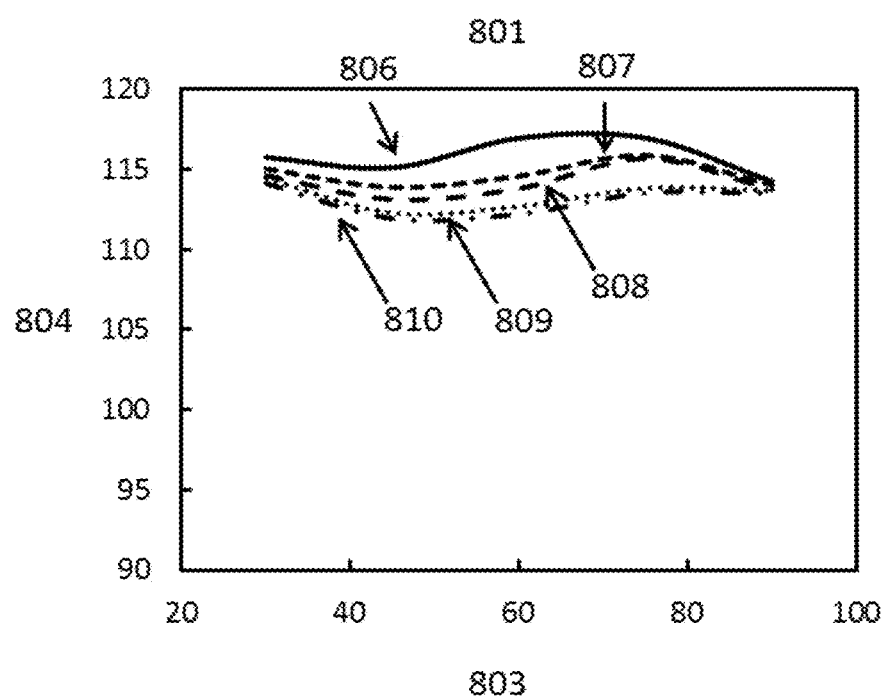
FIGS. 8A and 8B show plots of printed feature size and depositor efficiency as a function of fly height for depositors with varying degrees of delivery aperture divergence according to embodiments disclosed herein.
Figure 8B:
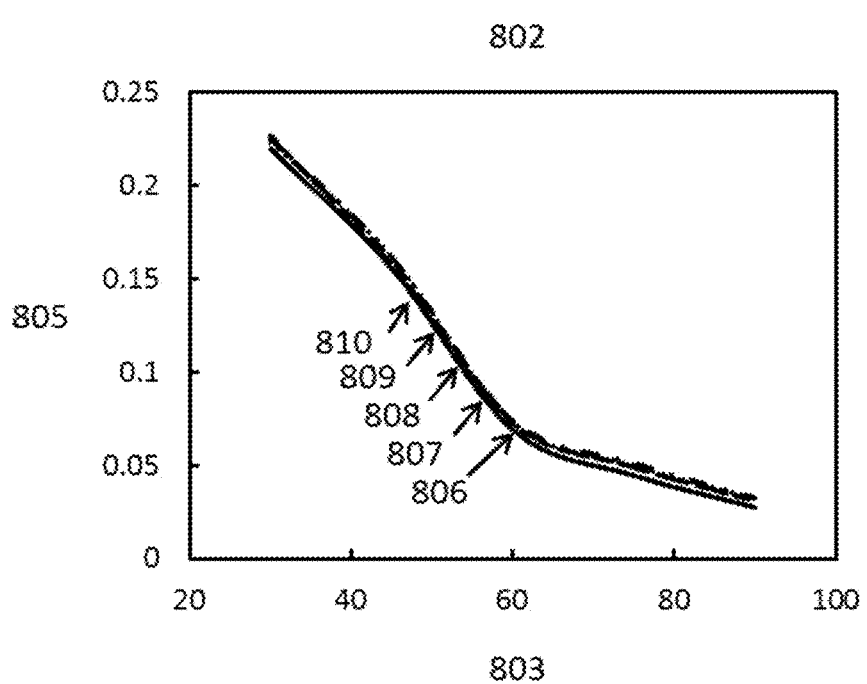

The deposition rate of the depositor depends both on the quantity of vapor ejected by the delivery aperture and on the efficiency η of the depositor, defined as the fraction of vapor ejected from the delivery aperture that adsorbs to the substrate. The deposited feature size is described by the full width to 5% of maximum thickness (FW5M) of the printed profile. FIGS. 8A and 8B show plots of feature size 801 and depositor efficiency 802 as a function of fly height, for a depositor with DE2=60 µm. The fly height is given in microns on the horizontal axis 803, while the resulting FW5M in microns and η are shown on the vertical axes, respectively. Curves are plotted for cases of FW=0 µm 806 (solid), 4 µm 807 (broken), 8 µm 808 (dash), 12 µm 809 (dot), and 15 µm 810 (dot dash).

As shown by FIGS. 8A-8B, it has been found that the depositor efficiency trends downward with increasing fly height. Accordingly, operating at a lower fly height generally is advantageous because it increases deposition rate, provided the fly height separation can be accurately maintained. In contrast, the feature size remains relatively constant with fly height and does not follow a clear trend.

The addition of divergence to the delivery aperture as disclosed herein has been found to reduce the feature size as measured by FW5M in all cases, with greater reduction resulting from a greater degree of divergence. Furthermore, the use of a diverging delivery channel does not significantly affect the deposition rate for a constant value of DE2 width and fly height, so the diverging channel may be used without penalty. Additionally, considering only the quantity of material deposited within the uniformity control width of 50 µm about the feature center, the diverging delivery aperture improves utilization efficiency. As shown in FIG. 6, the centers of the printed profiles are not only flatter, but they have a greater average thickness. The diverging aperture also has no detrimental effect on feature resolution, and in fact, improves it. Thus the diverging aperture allows for features with high thickness uniformity to be printed at low fly height, improving depositor efficiency and therefore deposition rate.

Depositor performance can be understood by the figure of merit FOM as defined in Equation 1. The FOM approaches zero past cutoffs for feature size and uniformity beyond which the depositor ceases to be useful for its intended application. Additional value is given for being well inside feature size and uniformity specifications, but this becomes asymptotically less as the specification is exceeded. In this case, the FW5M specification is 145 µm and the U50 specification is 95% in the presented application. The FOM depends linearly on n. A more efficient depositor is better, but there is no hard cutoff. The higher the FOM, the better the depositor is expected to perform.

$$FOM = \eta\left(1 + \tanh\left(\frac{U_{50} - 95\%}{2.5\%}\right)\right)\left(1 - \tanh\left(\frac{FW5M - 145\ \mu m}{2.5\ um}\right)\right) \quad (1)$$

Figure 9:
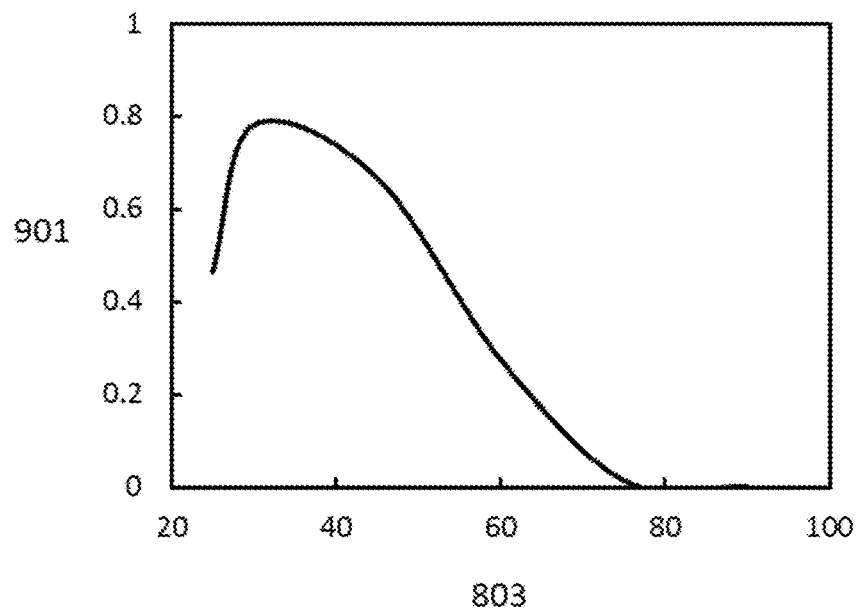
FIG. 9 shows an example of the change in figure of merit obtainable by a depositor with a diverging aperture configured to operate at a given fly height, as a function of fly height according to an embodiment disclosed herein.

A matrix of simulated depositors with DE2 from 40 to 90 µm, and FW from 4 to 15 µm were studied at fly heights ranging from 25 to 90 µm. The maximum FOM at each fly height is plotted in FIG. 9 as a function of fly height. The FOM is indicated on the vertical axis 901. The maximum FOM attainable at each fly height decreases, primarily because of the decrease in deposition efficiency. A maximum FOM of 0.78 is obtained at g=30 µm. Thus, in this example, the depositor should be operated relatively close to the substrate (30 µm) for best performance. The diverging delivery aperture allows the depositor to print features with good uniformity while operated in this position, as previously indicated.

Figure 10:
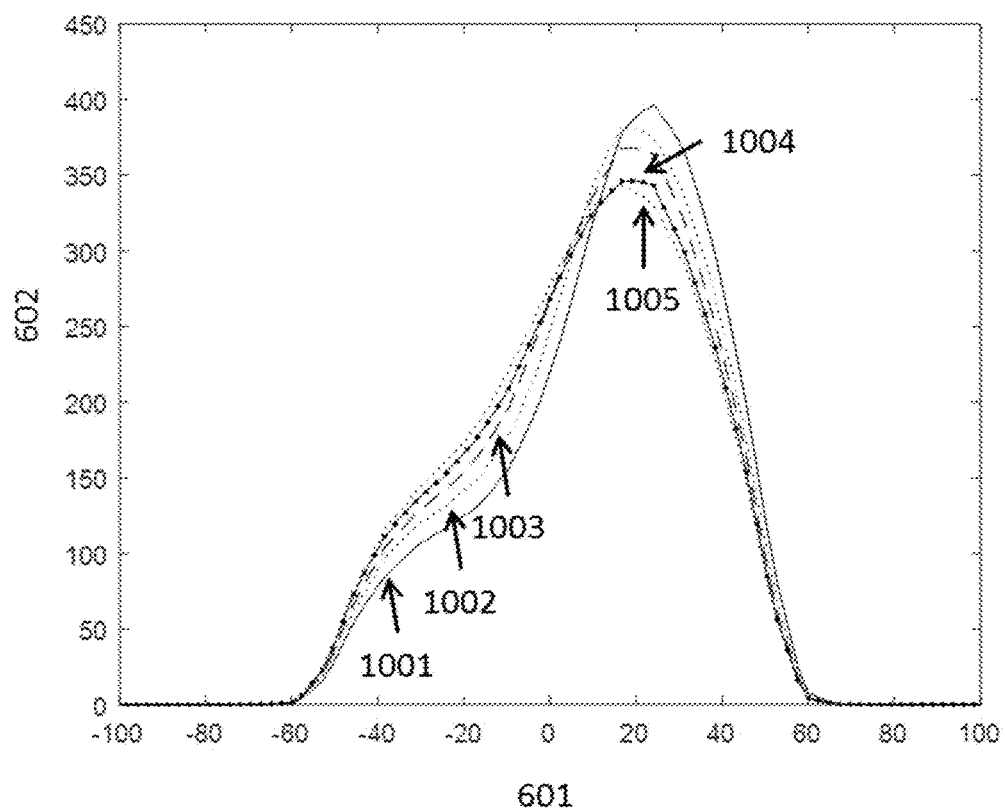
FIG. 10 shows a deposition profile generated by the upper half of depositors with varying degrees of delivery aperture divergence according to embodiments disclosed herein.

The deposition profile generated by the top half of the depositor is shown in FIG. 10 for divergences of FW=0 (1001), 4 µm (1002), 8 µm (1003), 12 µm (1004) and 15 µm (1005). The leftmost portion of the distribution is generated by vapor flowing from the delivery aperture to the far exhaust aperture, while the right side is generated by vapor flowing from the delivery aperture to the near exhaust aperture. The slope on the left slide of the distribution becomes more linear as the divergence FW increases, since the diverging sidewall of the aperture directs more flow inward across the centerline. At the same time, the left side of the deposition profile moves inward slightly with increasing divergence, leading to a reduction in the FW5M when the features are overlaid.

Figure 11A:
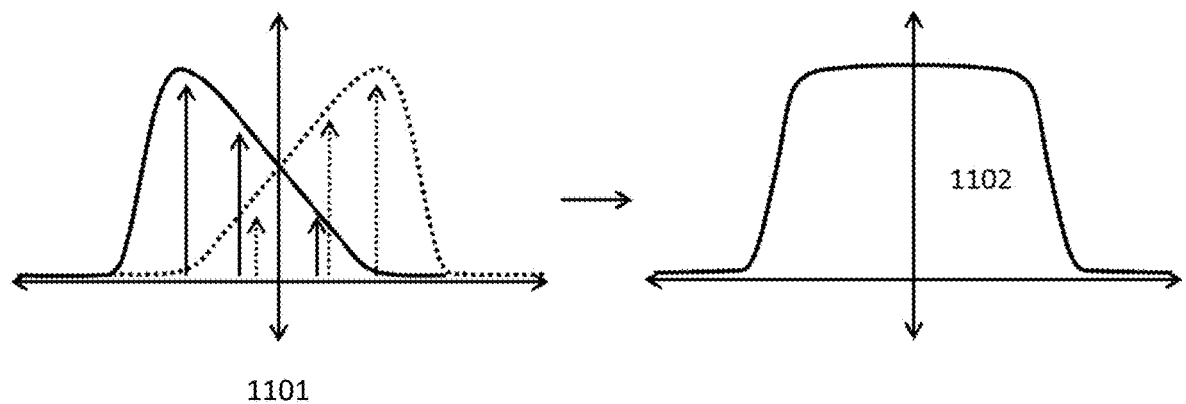
FIGS. 11A and 11B illustrate examples of the dependence of the uniformity of a composite feature on the shape of the component features used to construct the feature according to embodiments disclosed herein.

The net deposition profile is a superposition of material from the two depositor halves, i.e., the profile shown in FIG. 10 and a mirror image of it. The sum of the two profiles is flatter if the slopes of the overlapping portions are linear. The addition of two deposition profiles is illustrated as the overlap of a solid line profile and a dashed line profile in FIGS. 11A-11B. As shown in FIG. 11A, two mirror-image profiles with linear sidewalls 1101 produce a mesa-like feature 1102 when superposed with one another. The separation of the two profiles affects the width of the flat region, but it does not affect the uniformity within that width. This makes feature uniformity less susceptible to perturbation.

Figure 11B:
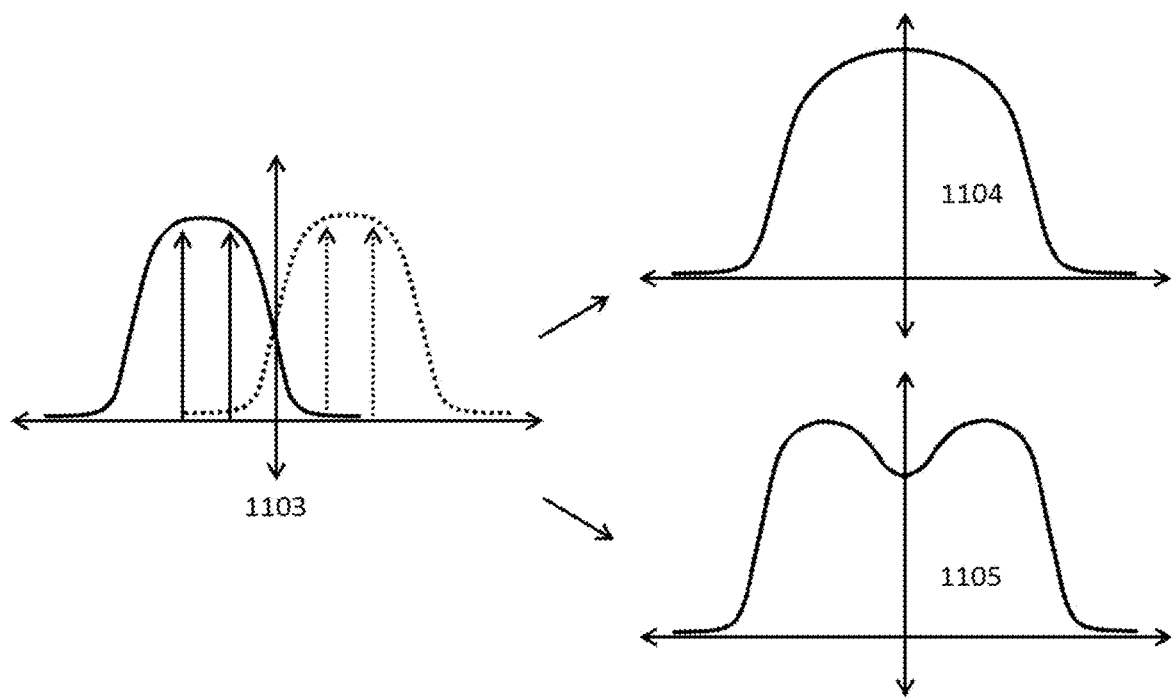

For comparison, FIG. 11B shows two profiles of a Gaussian shape 1103. When added, the combined profile is not only less uniform than the example shown in FIG. 11A, but its uniformity is more sensitive to process conditions. For example, the profiles may add to a combined profile with a single broader peak 1104, or they may add to a double peaked profile 1105.

Cases where diverging apertures were formed by tapering the narrow spacer between the delivery and exhaust channels were also evaluated. Creating a diverging nozzle in this way did not improve printing resolution or uniformity, but it did adversely affect depositor efficiency. It has been found that diverging apertures formed by tapering the wide DE spacer are useful.

Figure 12A:
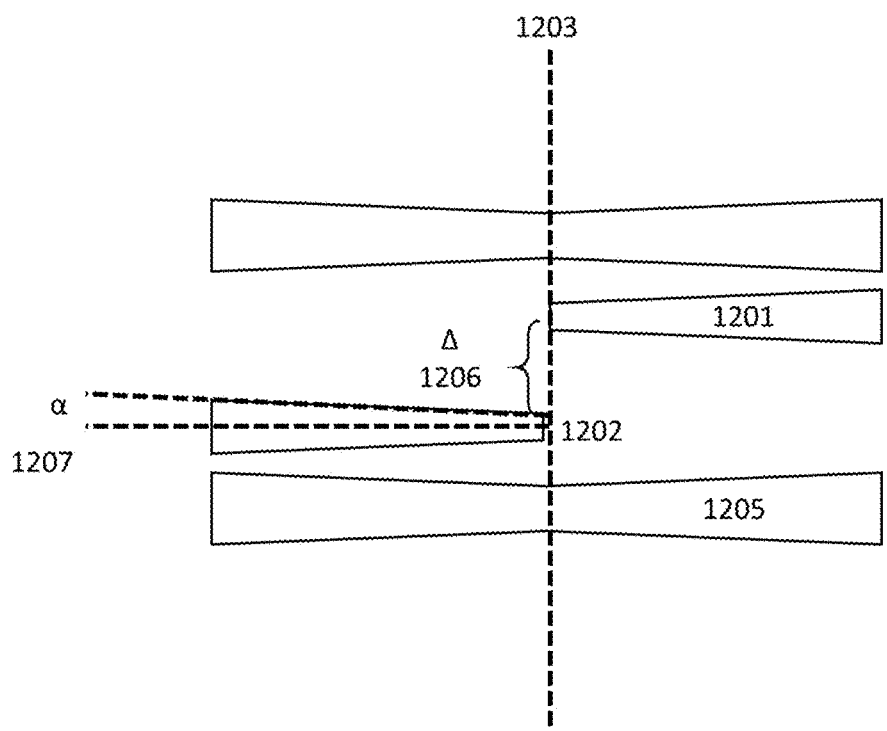
FIG. 12A shows an OVJP depositor with trapezoidal delivery apertures as seen from the substrate according to an embodiment disclosed herein.

In an embodiment, the uniformity and deposition efficiency achieved by an OVJP print head can be further enhanced by shaping the delivery aperture such that the maximum organic vapor flux onto the substrate is shifted towards the ends of the depositors. In an embodiment, this may be achieved by tapering the delivery aperture of the depositor such that it is wider at its ends than at the center of the depositor. FIG. 12A shows an example of such a depositor arrangement as viewed from the substrate, i.e., below the depositor during conventional operation. The delivery apertures 1201 are isosceles trapezoids with their short parallel edges 1202 at the depositor centerline 1203 and long parallel edges at the ends of the depositor. Trapezoidal aperture sections meeting at the centerline form a bowtie shape, as is apparent for the exhaust apertures 1205. As before, the delivery apertures are split and offset from each other along the centerline of the depositor to increase the uniformity of organic thin film deposition 1206. The degree of offset is defined as Δ=DE2-DE1. The width of the short parallel side is the nominal aperture width. The degree of taper can be expressed as the angle α 1207 between a center long axis of the delivery aperture and one long edge of the depositor aperture. In some embodiments, the exhaust apertures 1205 and/or the delivery apertures 1201 may be trapezoidal as shown. Alternatively, one or more apertures may be rectangular while the other apertures are trapezoidal.

Figure 12B:
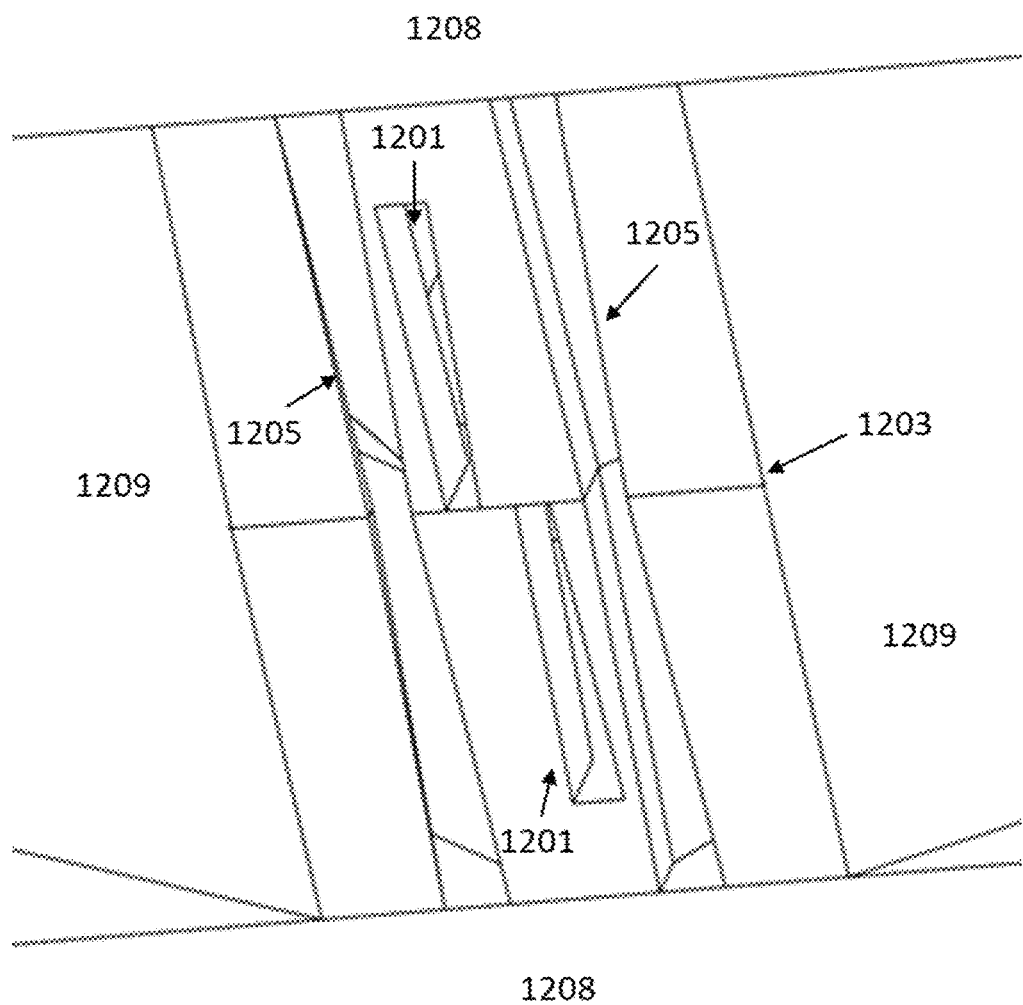
FIG. 12B shows a three-dimensional view of an OVJP depositor fabricated with deep reactive ion etching that manifests an undercut according to an embodiment disclosed herein.

If the depositor is made by the techniques described in US Pub. No. 2015/0376787, the taper may be formed from an undercut generated by deep reactive ion etching (DRIE). The undercut can be tuned to optimize the delivery aperture, but it also affects the exhaust apertures and the face of the depositor. This can be seen in a three-dimensional rendering of the depositor as shown in FIG. 12B. The centerline of the depositor is raised relative to its ends. The shape of the surfaces to the front and rear 1208 of the depositor are not believed to be critical to this application. Recesses to the right and left of the depositor 1209 form crosswise channels to promote the even flow of confinement gas into the deposition zone. The walls of these channels may also be subject to undercut, but this is not critical.

Figure 13:
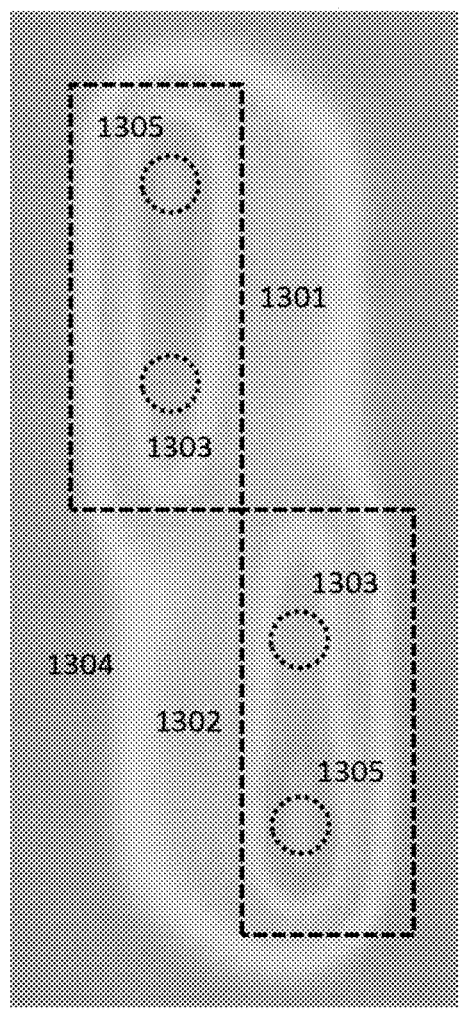
FIG. 13 shows a photograph of an organic thin film feature deposited by a stationary OVJP depositor with trapezoidal delivery apertures according to an embodiment disclosed herein, with gradations in thickness indicated by interference fringes.

The dominant effect of undercut is to force gas flowing through the delivery aperture towards the ends of the depositor. This leads to more rapid deposition of organic material towards the ends of the depositor. FIG. 13 shows a photograph of a thin film deposited by a stationary depositor as previously described, which illustrates this effect. The split channels generate two regions of relatively intense deposition, one in the upper left quadrant 1301 and the other in the lower right quadrant 1302. Considering a point on either of these regions that is relatively close to the depositor centerline 1303, there are approximately 1.5 thin film interference fringes between it and the boundary of the deposition zone 1304. This indicates a film thickness of approximately 220 nm. Points further from the centerline 1305 show two full interference fringes, indicating a film thickness of 290 nm. Thus, it can be seen that the deposition is biased towards the outside of the depositor.

The local width of a channel may have a disproportionate effect on the local flow through a given section of a long aperture. Assuming that gas flowing through the narrowest portion of the channel behaves as a lubrication flow, then the flow per length q scales as the third power of the local channel width. The flow through an isosceles trapezoid channel given as an example in FIG. 3 is given by Equation 2:

$$q = \frac{4Q}{l(w_1+w_2)(w_1^2+w_2^2)}\left(w_1 + \frac{w_2-w_1}{l}z\right)^3 \quad (2)$$

Figure 14:
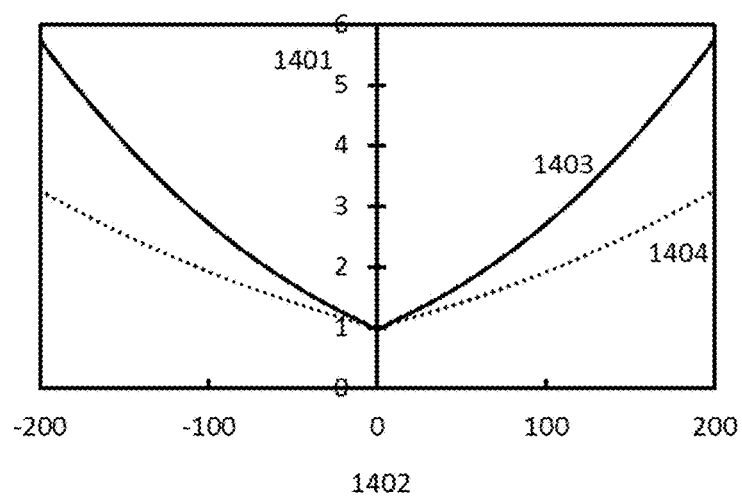
FIG. 14 shows a plot of the normalized gas flow per unit length through trapezoidal delivery and apertures and bowtie shaped exhaust apertures according to embodiments disclosed herein.

The nominal width at the center is $w_1$ and the width at the end is $w_2$. A normalized graph of q through a delivery channel that is 400 μm long, 15 μm wide at its center, and with an angle α of 1.7° is shown in FIG. 14. The flow per unit length through the delivery aperture is shown on the vertical axis 1401 as a function of position with respect to the depositor centerline on the horizontal axis 1402. The flow through the delivery aperture is shown as a solid line 1403, normalized such that a flow of 1 passes through the midline of the depositor. Flow through the outer portions of the delivery aperture is nearly six times the flow through the center. The flow through an exhaust aperture with a centerline width of 25 μm is shown as a dotted line at 1404, also normalized to have a value of 1 at the depositor midline. The change in exhaust flow is proportionally less than that of the delivery flow along the length of the depositor. The exhaust channel has a greater centerline width, so the undercut leads to less relative change in width along its length. The ratio of delivery flow to exhaust flow is, therefore, greater at the ends of the depositor than at the center and more organic material reaches the substrate at the ends of the depositor. Undercuts of the exhaust channel and the depositor face both tend to force deposition inward, but their effects are small relative to the undercut of the delivery channel.

Figure 15A:
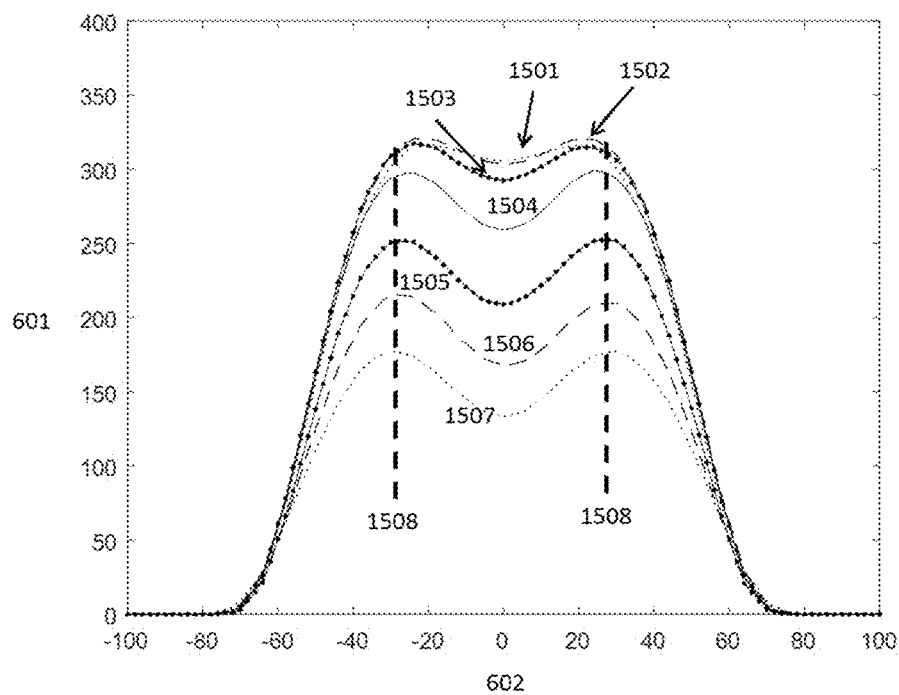
FIG. 15A shows examples of deposition profiles generated by OVJP depositors with various degrees of aperture taper according to embodiments disclosed herein.

FIG. 15A shows deposition profiles generated by depositors with varying degrees of undercut. Deposition profiles are shown for undercuts of α=1.7° (1501), 1.1° (1502), 0.57° (1503) and 0 (1504). The deposition profiles generated by depositors for which the aperture tapers and becomes narrower further from the centerline are plotted for a of −0.57° (1505)−1.1° (1506) and −1.7° (1507). As shown, it was found that both deposition rate and uniformity increase with greater a and, conversely, decrease with negative a. The deposition rate scales with the area under each curve, so taller curves represent faster deposition and more efficient utilization of material. Uniformity is determined by the flatness of the deposition profile near its center as previously described. Apertures with a less than 0 produce deposition profiles with two peaks (1508), corresponding to the position of the delivery apertures and a valley between them. This peaked structure reduces uniformity, and the flatter profiles generated by apertures with positive a values are preferable. The marginal benefit of increasing a from 1.1° and 1.7° is minimal, suggesting that a values in this range are optimal or near optimal. That is, in embodiments disclosed herein it may be preferred to use trapezoidal delivery apertures having a in the range of 1.1-1.7° or, more generally, 1.0-2.0°. In some embodiments, it may be preferred to have a of about 1.7° or, more generally, 1.5-1.9°, 1.6-1.8°, or the like.

Figure 15B:
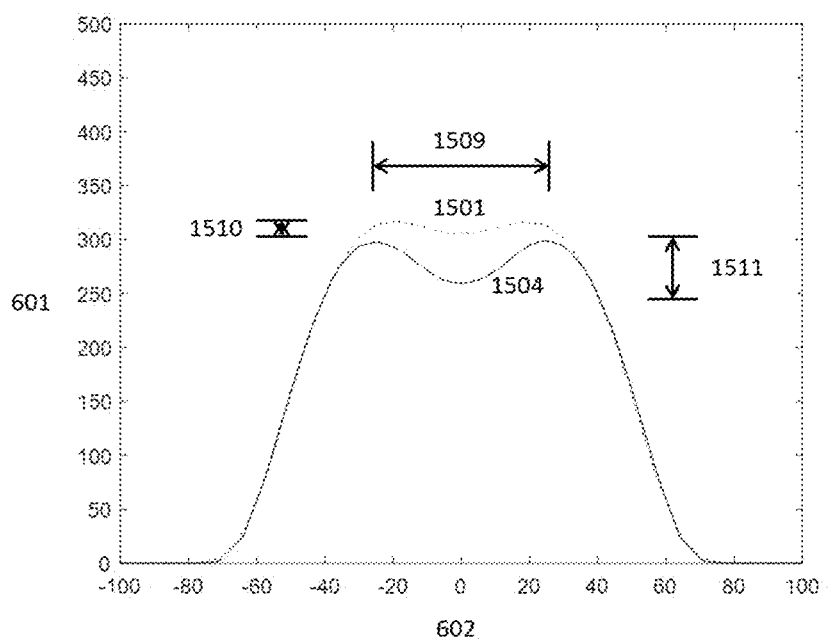
FIG. 15B shows a comparison of deposition profiles for a depositor with a trapezoidal delivery aperture and a depositor with a rectangular delivery aperture according to embodiments disclosed herein.

The cases of rectangular apertures with α=0 and trapezoidal apertures with α=1.7° are compared in FIG. 15B. The thickness uniformity, U50, is defined as the maximum thickness less the minimum thickness over the average thickness over a width of 50 μm across the center of the feature, shown at 1509 for reference. The difference between the maximum and minimum over this range is much less for the trapezoidal apertures 1510 than for the rectangular apertures 1511. The U50 for the trapezoidal depositors is 96%, compared with 86% for rectangular depositors. Likewise, the efficiency η with which material is deposited on the substrate increases from 15.8% to 16.8% for the trapezoidal depositor apertures compared to rectangular. The feature size, defined as the full width of the deposition profile to 5% of its maximum (FW5M), increases by only 1.2 μm, going from 133.6 μm for the rectangular aperture to 134.8 μm for the trapezoidal aperture.

The utility of trapezoidal apertures can further be shown by a parametric study in fly height g for four different channel geometries with split delivery apertures. The channel geometries are defined by a and the center-to-center separation of the delivery aperture A and as indicated in Table 2:

TABLE 2

| Depositor | Δ (μm) | α (deg) |
|---|---|---|
| A | 45 | 0 |
| B | 45 | 1.7 |
| C | 55 | 0 |
| D | 55 | 1.7 |

Figure 16:
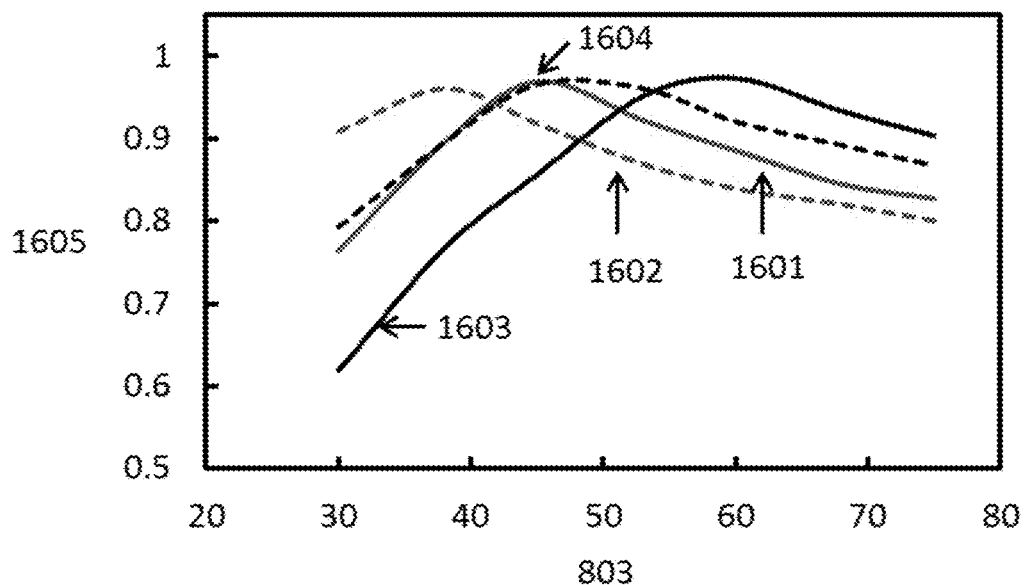
FIG. 16 shows a plot of film thickness uniformity achieved by different depositors with trapezoidal apertures as a function of fly height according to embodiments disclosed herein.

Feature uniformity is normally very sensitive to fly height. A trapezoidal aperture configuration can reduce the sensitivity of U50 as previously defined to fly height for a given feature size and fly height range. FIG. 16 shows plots of U50 for depositors A-D shown in Table 2 (1601 to 1604, respectively) as a function of fly height. The vertical axis 1605 indicates U50. All of the curves have approximately the same maximum of U50=0.96, but the curves 1602, 1604 for depositors with α=1.7° have a broader maximum than the curves 1601, 1603 for depositors A and C with α=0. This indicates that U50 is less sensitive to fly height variation within the region of interest for printing for trapezoidal apertures compared with rectangular apertures. Furthermore, curves B and D have their uniformity maxima at a lower fly height than A and C respectively.

Figure 17A:
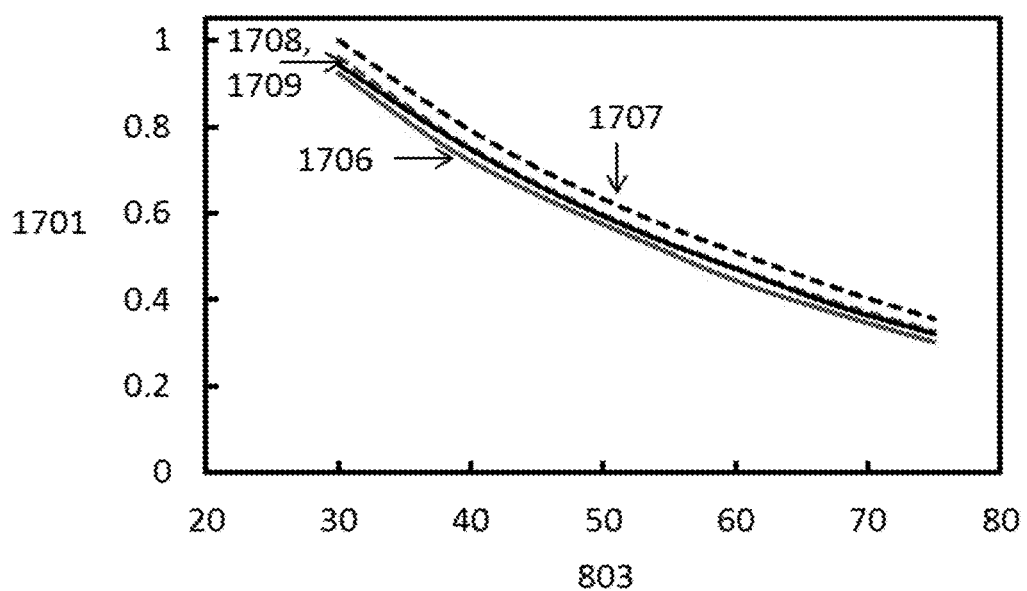
FIG. 17A shows a plot of material deposition rates achieved by depositors with trapezoidal apertures according to embodiments disclosed herein, as a function of fly height.
Figure 17B:
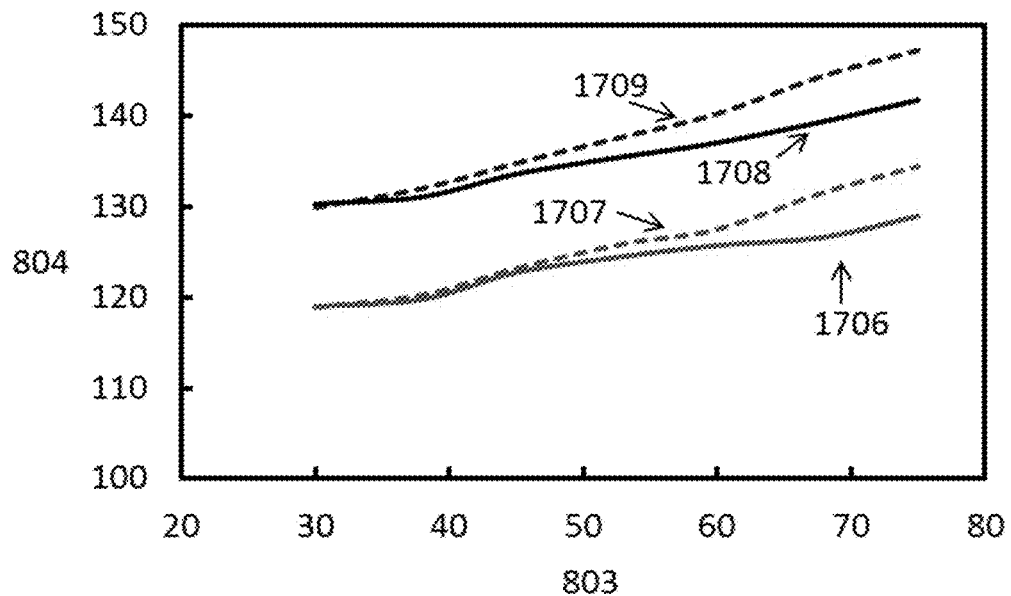
FIG. 17B shows a plot of feature size printed by different depositors with trapezoidal apertures according to embodiments disclosed herein as a function of fly height.

The deposition rate for each of the four depositors described in Table 2 is plotted in FIG. 17A as a function of fly height. The deposition rate indicated on the vertical axis 1701 is normalized. The deposition rate curves are plotted for depositors A-D as 1702, 1703, 1704, and 1705, respectively. It was found that depositors with larger A deposit at a higher rate, while depositors with greater a have a higher deposition rate for a given A. The associated feature size is plotted in FIG. 17B as a function of fly height. Curves are shown for depositors A-D as 1706-1709, respectively. It can be seen that the feature size is primarily determined by A and is relatively insensitive to a for fly heights less than 50 μm. For g greater than 50 μm, the feature size increases more rapidly for nonzero a.

These data also indicate that depositors with greater A or a yield greater deposition rates. Furthermore, the presence of a taper such that a is greater than zero reduces the optimal fly height for a given A. As before, lower fly heights generally are preferable due to greater deposition efficiency. Since feature size does not increase with a at low fly height, a trapezoidal depositor allows deposition rate and uniformity can be improved without penalty by operating at a lower fly height.

Figure 18:
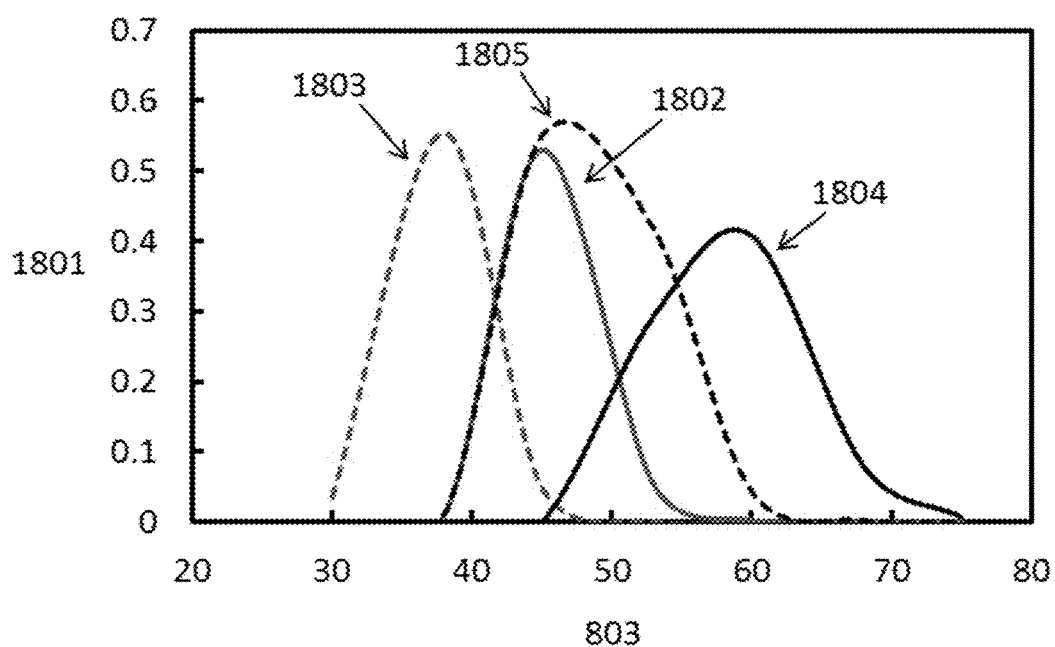
FIG. 18 shows a plot of the figure of merit (FOM) for different depositors with trapezoidal apertures according to embodiments disclosed herein as a function of fly height.

FIG. 18 shows the FOM as previously defined as functions of fly height. The FOM is indicated on the vertical axis 1801 and curves are plotted for depositors A, B, C, and D 1801-1805, respectively. Each depositor has an optimal fly height at which its figure of merit is optimized. As with the deposition uniformity, the optimal fly height tends to increase with A and a. Depositor D, which has a trapezoidal design, has the greatest value of its FOM maximum. Furthermore, the curve for depositor D has a broader peak than the next highest curve, which is depositor A. This implies that the performance of depositor D is less dependent on fly height than that of A. The trapezoidal design permits uniformity and feature size specifications to be met while allowing greater deposition rate and stability with fly height.

Figure 19A:
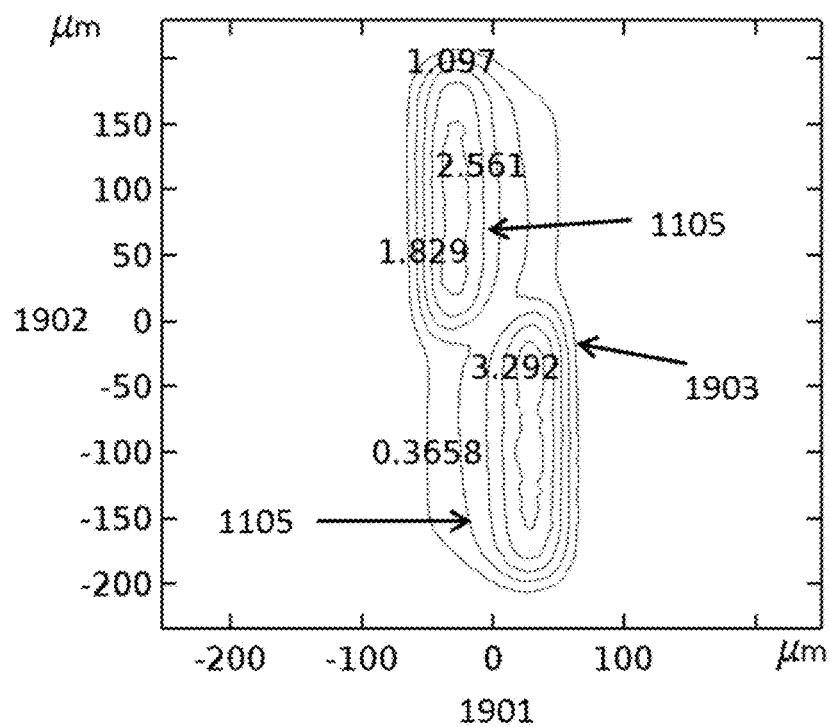
FIGS. 19A and 19B show contour plots of the deposition field onto a substrate generated by depositors with trapezoidal and rectangular delivery apertures according to embodiments disclosed herein.
Figure 19B:
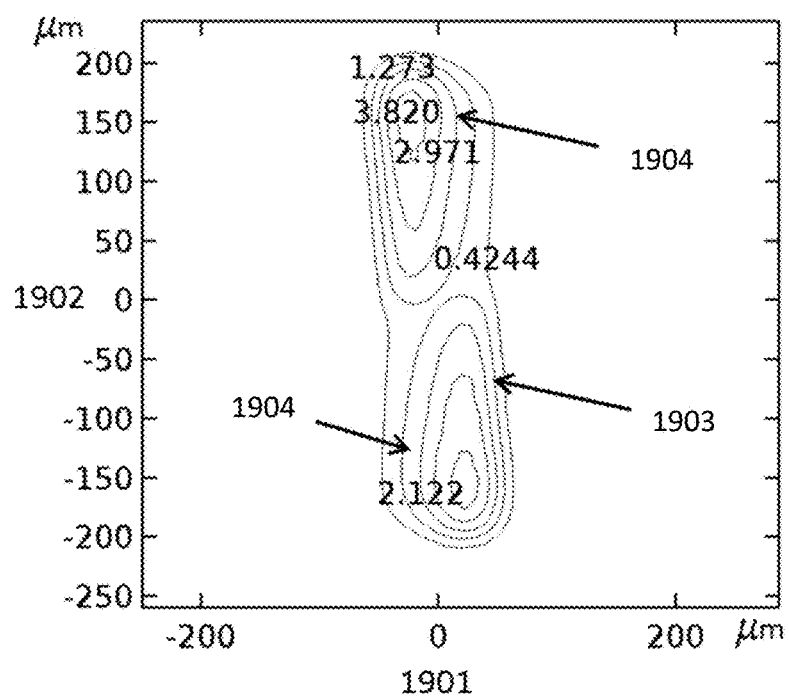

The field of organic flux onto the substrate generated by depositors C and D are plotted in FIGS. 19A and 19B, respectively. The horizontal axis 1901 gives distance orthogonal to the direction of printing, measured from the middle of the depositor, in microns. The vertical 1902 axis gives distance parallel to the direction of printing, measured from the depositor midline in microns. Contours 1903 give the strength of organic flux onto the substrate in arbitrary units. It can be seen than FIG. 19B is a better match for the experimental result pictured in FIG. 13 than FIG. 19A, indicating that undercut apertures affect simulated and experimental results similarly. One relevant difference between the flux fields in FIGS. 19A and 19B is that the plume of intense deposition extends further across the spacer between the delivery channel and the far exhaust in the case of the trapezoidal apertures 1904 compared with the rectangular apertures 1905.

Figure 20:
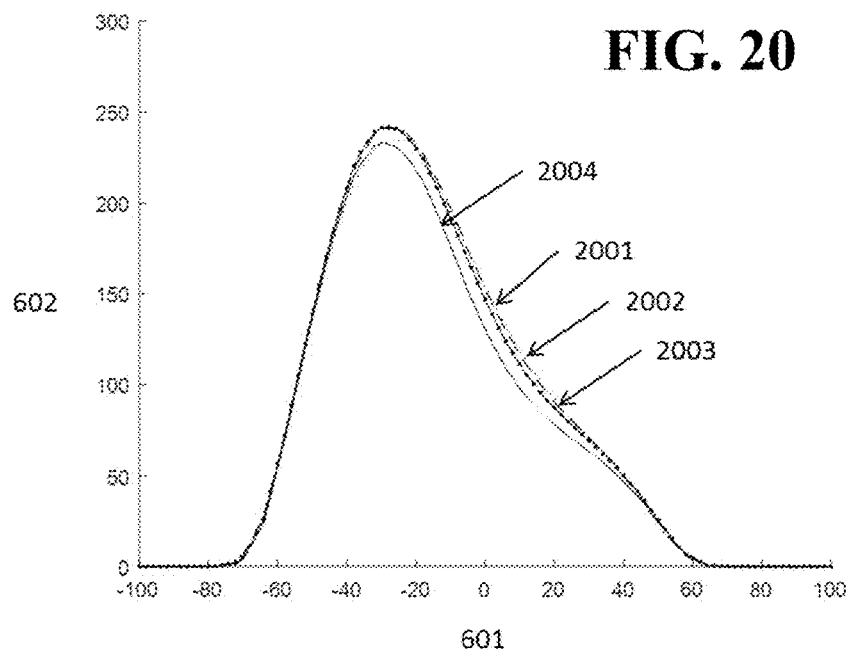
FIG. 20 shows a deposition profile generated by an upper half of a depositor with aperture sides defined by varying degrees of undercut according to embodiments disclosed herein.

As with the flared depositor, this extra flux makes the thickness profile of material deposited by each half depositor more linear within the zone where they add. The deposition profile generated by the top half of the depositor is shown in FIG. 20 for undercuts of α=1.7° (2001), 1.1° (2002), 0.57° (2003) and 0° (2004). The leftmost portion of the distribution (to the left of the peak) is generated by vapor flowing from the delivery aperture to the near exhaust aperture, while the right portion is generated by vapor flowing from the delivery aperture to the far exhaust aperture. The slope on the right slide of the distribution becomes more linear as a increases.

Figure 21:
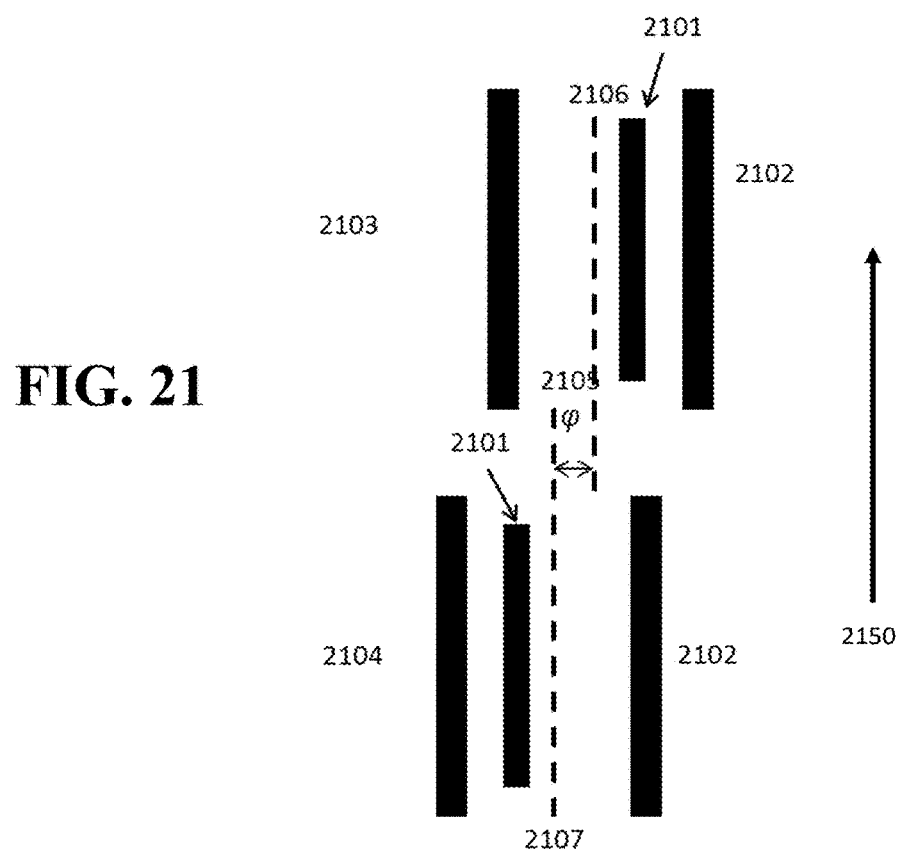
FIG. 21 shows the aperture configuration of a depositor divided into mirror image sections arranged in two offset ranks according to an embodiment disclosed herein.

The use of flared and/or trapezoidal delivery apertures may be subject to the constraint that Δ=DE2-DE1. Therefore, the shape of the thickness profile set down by each half of the depositor is dependent on the offset between the two halves of the depositor. In some embodiments, the relationship between DE1, DE2 and A can be broken by separating the depositor into two separate ranks. FIG. 21 shows an example arrangement of depositor apertures that include two ranks. In this arrangement, both the delivery aperture 2101 and exhaust aperture 2102 are discontinuous. The upper rank 2103 and lower rank 2104 are mirror images of each other, as the depositor halves were before, but the centers of the delivery apertures are now offset from each other by a distance φ 2105. Here the center is defined as the midline between the outer edges of the exhaust aperture on each depositor half, shown at 2106. In this configuration, Δ=DE2-DE1+φ. The arrangement of separate ranks may be described in terms of their position relative to one another during use of the depositor to deposit material on a substrate. Generally, the depositor and the substrate will be in relative motion during material deposition. For example, the depositor may move relative to the substrate in a direction 2150 as shown. The apertures in such a configuration may be described as being in a "leading" or "trailing" position in that case. For example, the upper rank 2103 may be described as being in a "leading" position relative to the lower rank 2104, since it is disposed in a more forward position on the depositor when the depositor is operated. Similarly, an axis of the depositor and/or any set of apertures in the depositor that is parallel to the direction of relative movement 2150 may be referred to as a "leading/trailing axis" of the depositor or of the apertures. In some embodiments, one or more ranks of delivery and/or exhaust apertures may be disposed on a depositor relative to the leading/trailing axis so as to deposit material along a consistent desired path relative to the movement.

Figure 22:
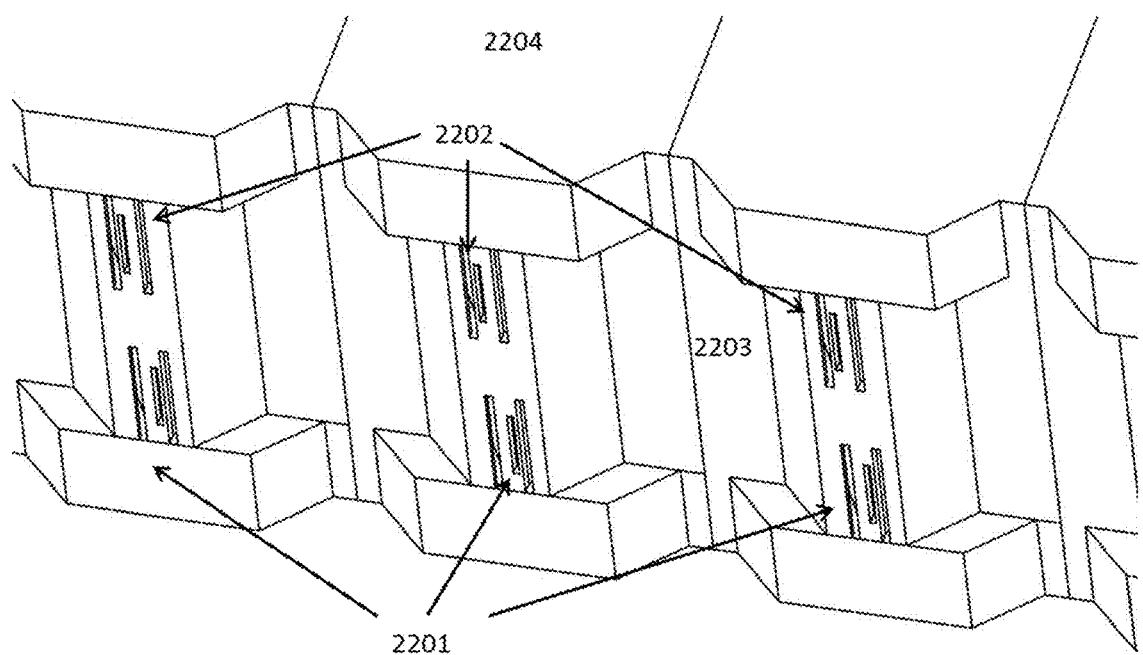
FIG. 22 show a three dimensional rendering of an array of two-rank depositors according to an embodiment disclosed herein.

In an embodiment, the depositors may be arranged in one or more linear arrays as shown in the example three-dimensional view of FIG. 22. Each line of depositor halves may be referred to as a rank. The first rank 2201 is located along the lower portion of the die edge and the second rank is on the upper portion 2202. A printed feature is complete when both ranks of the depositor make a printing pass over it. Transverse confinement gas channels 2203 remain aligned and normal to the die face 2204 through both ranks of the depositor.

Various geometries may be used for the separate depositor halves. Several examples are listed in Table 3:

TABLE 3

| Depositor | DE1 (μm) | DE2 (μm) |
| --- | --- | --- |
| A | 10 | 10 |
| B | 10 | 30 |
| C | 10 | 40 |
| D | 20 | 30 |
| E | 20 | 40 |

Figure 23:
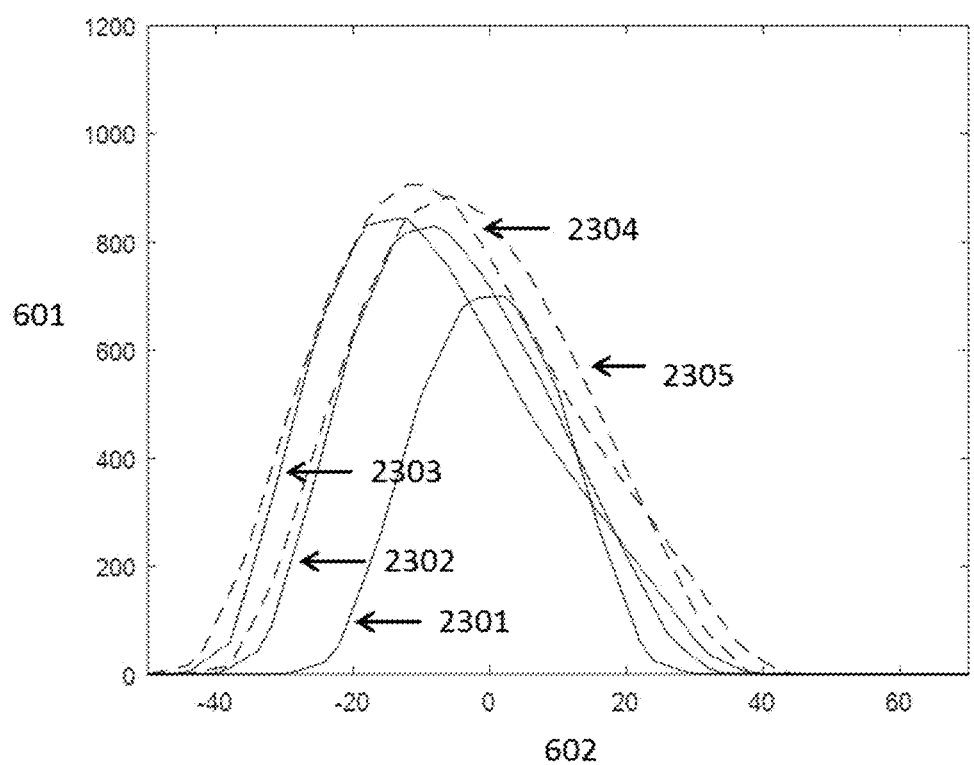
FIG. 23 shows deposition profiles produced by a single rank of a two-rank depositor according to an embodiment disclosed herein.

FIG. 23 shows example deposition profiles for depositors having the geometries shown in Table 3. Profiles for depositors A-E are shown as profiles 2301-2305, respectively. A sharp transition between printed and non-printed zones generally requires a narrow DE1 spacer, since DE1 defines the outer edge of the printed pattern. At the same time, a wider DE2 spacer makes thickness slope of the inner edge of each half pattern more gentle and linear. Adjusting DE2 and $\phi$ controls the width of the linear region of the printed feature.

Figure 24:
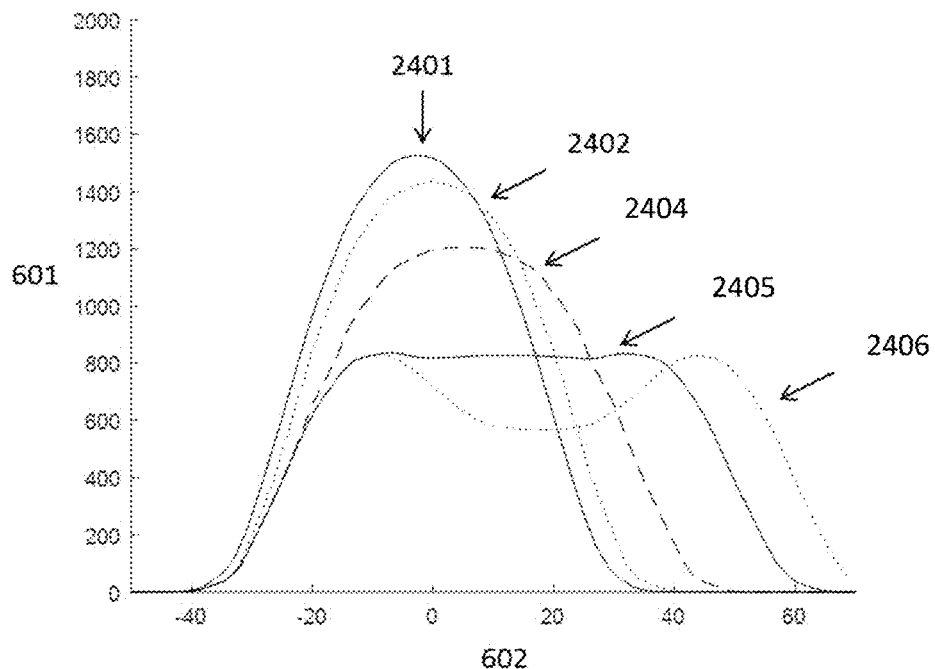
FIG. 24 shows deposition profiles produces by a two-rank depositor with various offsets between its ranks according to an embodiment disclosed herein.

FIG. 24 shows the added profiles for two depositor halves for a depositor having configuration B in Table 3. Profile traces for $\phi$=−5 μm, 0 μ, 10 μm, 25 μm, and 35 μm are plotted as 2401, 2402, 2404, 2405, and 2406, respectively. It can be seen that the resulting traces are more sharply peaked for lower values of $\phi$ and flatter for larger $\phi$. The $\phi$=0 case reflects the same profile resulting from the case of a depositor with a split delivery aperture as previously disclosed. The peaks generated by the two halves of the depositor are insufficiently separated, so a peaked thickness profile is produced. The width over which the thickness of the printed feature is uniform significantly increases in the $\phi$=25 μm case. Due to the additional offset between the two ranks of the depositor, the U50 value for this arrangement is 97.4%.

Figure 25:
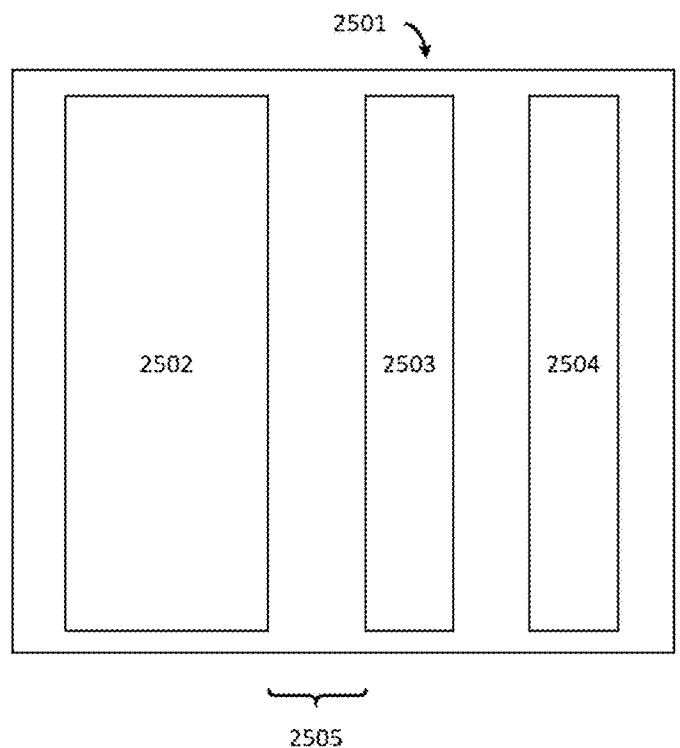
FIG. 25 shows an example arrangement of a pixel with red, green, and blue subpixels that may be suitable for a display printing application according to an embodiment disclosed herein.

Depositors with small DE spacers, such as depositors A and B, may be suitable for deposition of subpixels for RGB arrays with a very fine pixel pitch, like 8K displays. The pixel geometry of such a device may require a mix of wider and narrower subpixels due to differences in surface area of each color of device. An example of such a pixel arrangement is shown in FIG. 25. The overall pixel 2501 is a square 190 μm on a side. The blue subpixel 2502 is 50 μm wide, while the green and red subpixels 2503, 2504, respectively, are 25 μm wide. The active areas of each subpixel are surrounded by a 30 μm wide inactive border 2505 between them. The thickness profile of a printed feature may extend into the border, but not into a neighboring active region. The blue feature may be no wider than 110 μm, while the red and green features must be less than 85 μm wide.

Figure 26A:
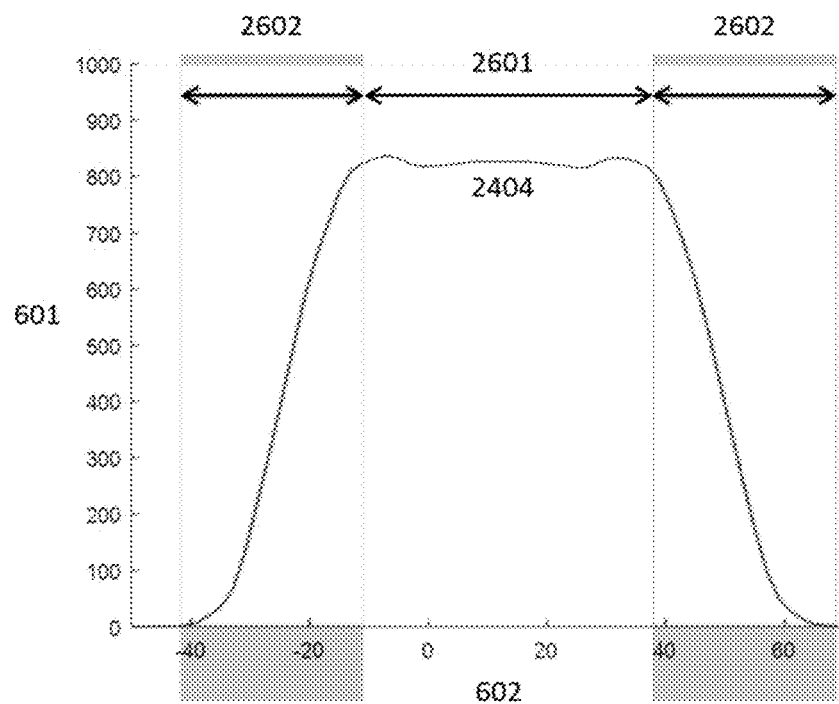
FIG. 26A shows dimensions of a blue subpixel overlaid with a deposition profile of a two-rank depositor designed to print the blue subpixel according to an embodiment disclosed herein.
Figure 26B:
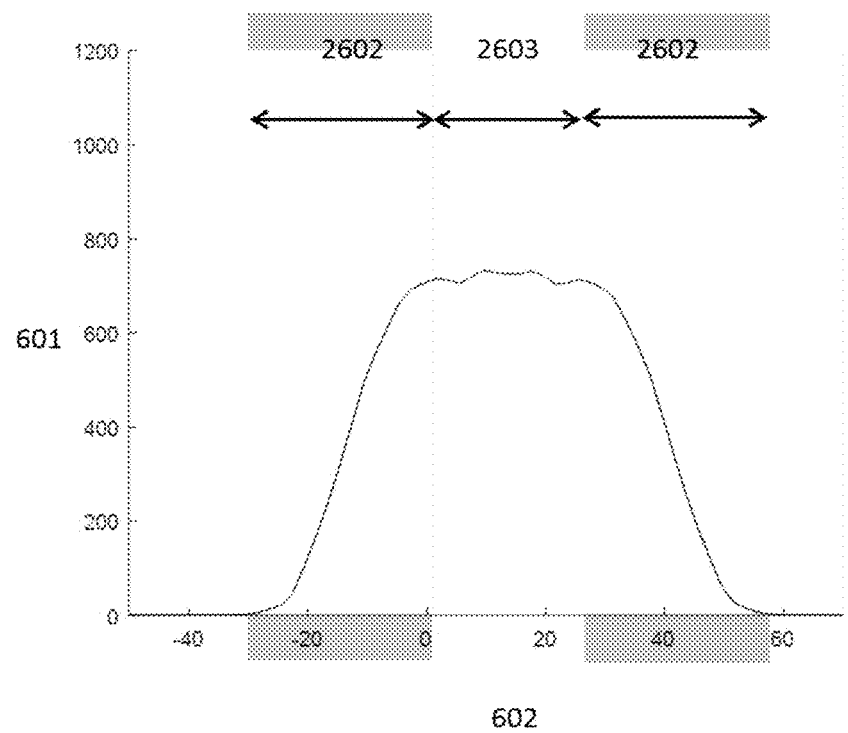
FIG. 26B shows the dimensions of a red or green subpixel overlaid with the deposition profile of a two-rank depositor configured to print the red or green subpixel according to an embodiment disclosed herein.

FIG. 26A shows a profile generated by a depositor having configuration B at $\phi$=25 μm for a blue subpixel, such as for use in a full-color OLED device. The width of the active area of the blue subpixel 2601 and the width of the borders 2602 are shown. The uniformity in the active area is excellent. The feature width FW5M is 94.3 μm and the entire width of deposition is enclosed within the borders. In contrast, a profile generated by a depositor having configuration A at $\phi$=27.5 μm, for example for a red or green subpixel, is shown in FIG. 26B. The width of the active area of the subpixel 2603 and the border widths 2602 are shown. In this case, the U25 uniformity (i.e., uniformity over 25 μm), is a more meaningful uniformity measurement than U50 for the depositor, since the active area is narrower. The U25 uniformity of this printed feature is 96.0% and the FW5M feature size is 74.6 μm.

The transition width between printed and non-printed zones must be narrower than the borders in all cases, so sidewall profile specification for all printed features is similar. This defines DE1. The depositor printing the blue subpixel, however, must maintain uniformity over a wider region than the depositors depositing red and green subpixels. Likewise, the feature size of the depositor printing the red and green subpixels must be smaller than is permitted of the blue depositor. The ability to adjust A independently of DE1 and DE2 makes it possible to design depositors for both subpixel dimensions. The two rank design can be combined with either flared delivery channels or trapezoidal delivery apertures to provide further degrees of design freedom to improve feature uniformity. Furthermore, dice with three or more ranks of depositors may be used.

Figure 27A:
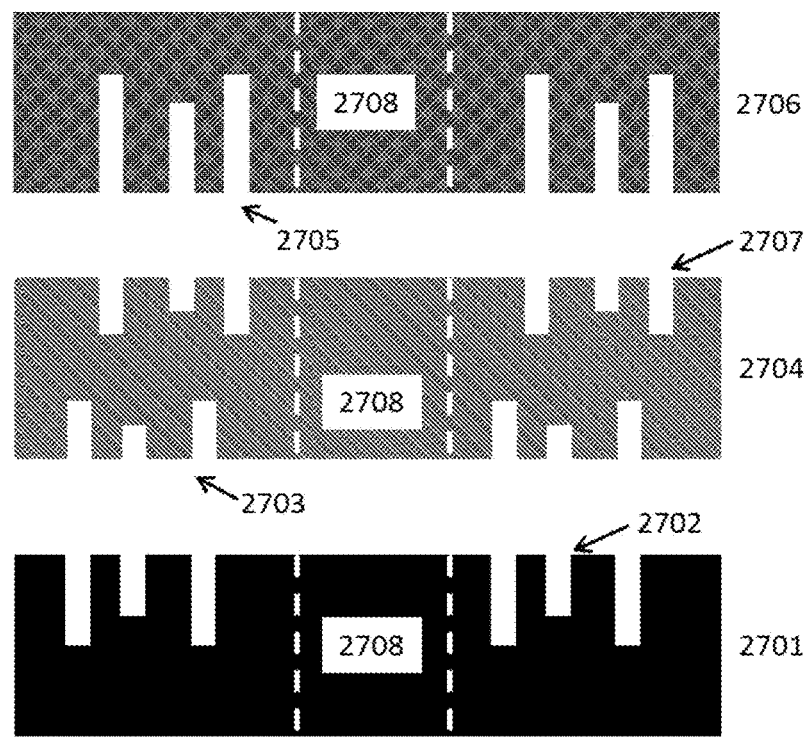
FIG. 27A shows an assembly of three wafers to make a two-rank depositor according to an embodiment disclosed herein, viewed from the plane of the depositor apertures.

A two-rank depositor as disclosed herein may be fabricated using a technique such as those disclosed in US Patent Pub. No. 2015/0376787, with the addition of an additional wafer. Each die may be formed from the bonding of three Si layers with etched trenches. FIG. 27A shows an example arrangement of depositor faces split between wafers layers. In this arrangement, the inner surface of the bottom wafer of the stack 2701 may be etched with trenches 2702 that become the apertures of the first depositor rank. The trenches 2702 may have corresponding trenches 2703 on the lower surface of the middle wafer 2704, which form lengthened apertures when the wafers are bonded. Trenches 2705 for the second rank may be etched into the inner surface of the top wafer 2706 of the stack. These trenches 2705 may have corresponding trenches on the top surface 2707 of the middle wafer. Recesses 2708 that form crosswise channels for confinement gas flow may be aligned between the wafer layers.

Figure 27B:
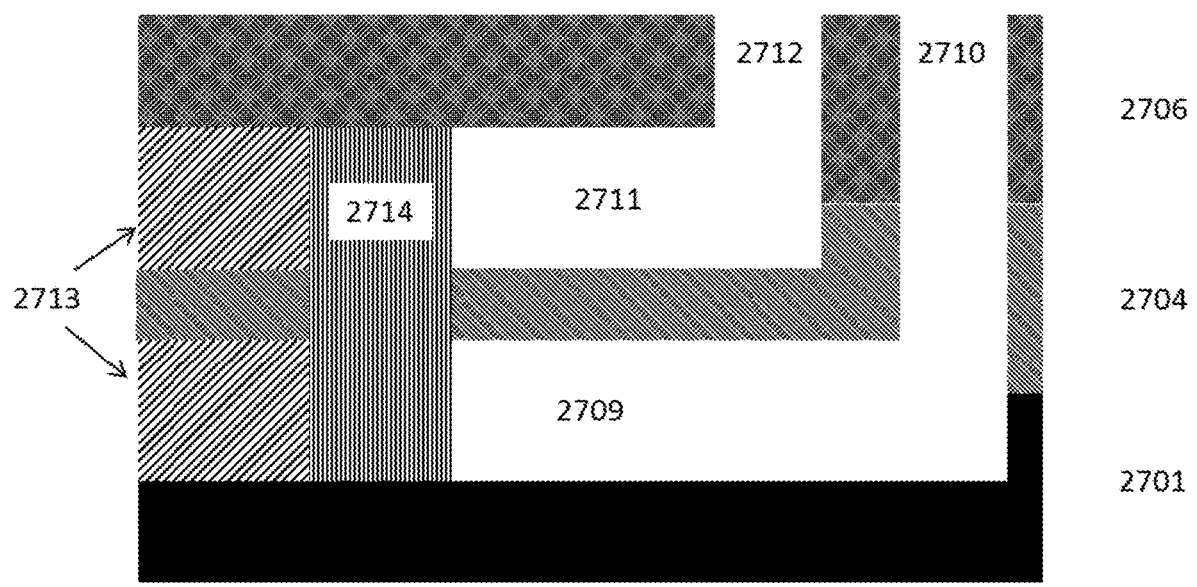
FIG. 27B shows routing of delivery and exhaust channels through a cross-section of a die containing two-rank depositors according to an embodiment disclosed herein.

FIG. 27B shows an example arrangement for routing for the delivery and exhaust channels according to an embodiment of a depositor as disclosed herein. The die is shown in cross section normal to the connecting each rank of depositor halves. The delivery flow may be routed through common delivery channels 2709 that are formed from trenches between the bottom and middle wafers as previously disclosed with respect to FIG. 27A. The delivery flow may be fed into the array through a delivery via 2710 arranged normal to the die face. The exhaust flow may be routed through common exhaust channels 2711 formed from trenches between the middle and top wafers as previously disclosed. The exhaust flow may exit the depositor through an exhaust via 2712 that is also normal to the die face. The common delivery and exhaust channels may be positioned on separate levels of the wafer stack, but each may serve both ranks of depositor halves 2713. A crossover zone 2714 adjacent to the depositor halves may contain internal vias that permit local delivery and exhaust channels of each rank to connect with the common delivery and exhaust channels.

Figure 28A:
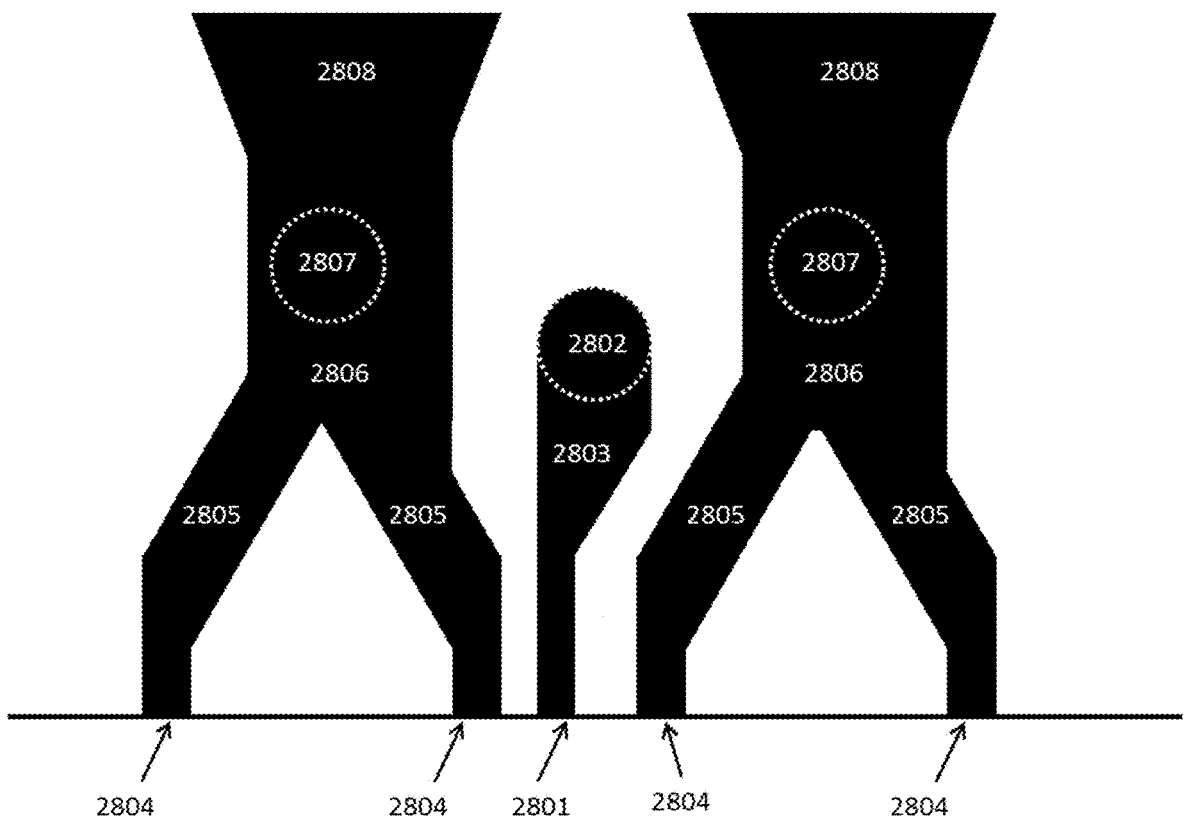
FIG. 28A shows channel traces of the first rank of a depositor according to an embodiment disclosed herein.
Figure 28B:
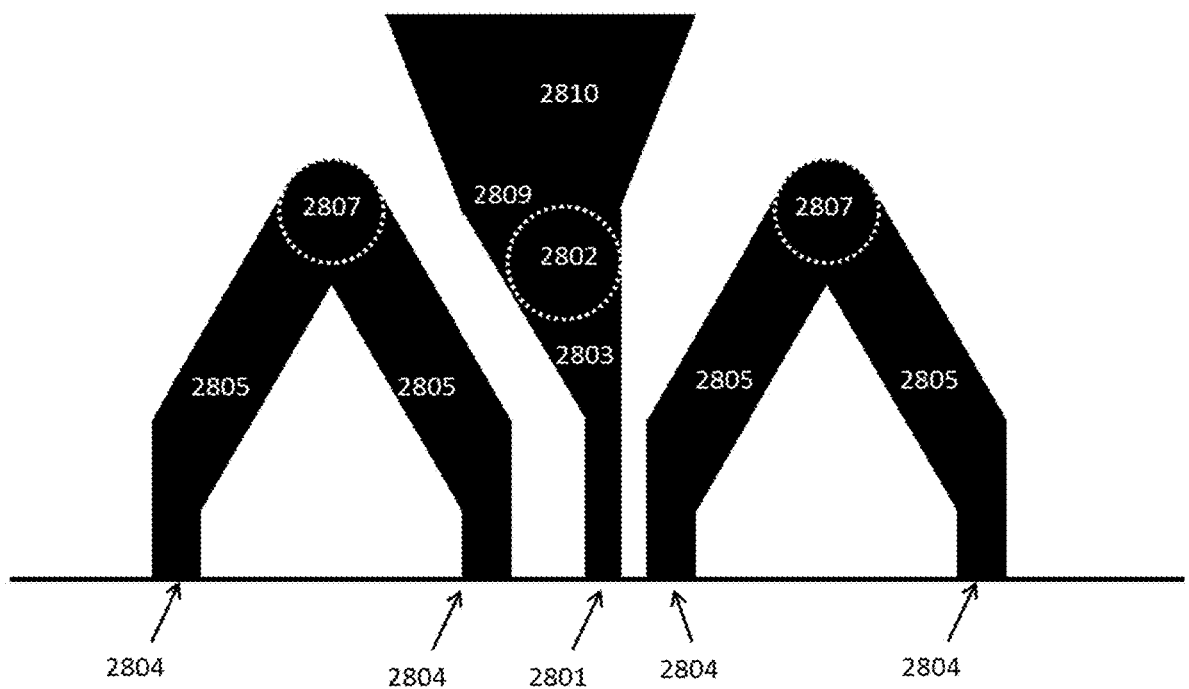
FIG. 28B shows channel traces of the second rank of a depositor according to an embodiment disclosed herein.

FIG. 28A shows an example channel arrangement for a first depositor rank according to an embodiment disclosed herein. In this arrangement, the delivery aperture 2801 connects to a local delivery via 2802 through a local delivery channel 2803. The local delivery via connects to a delivery plenum in the second rank. The exhaust apertures 2804 connect to local exhaust channels 2805 which combine with local exhaust channels from adjacent exhaust apertures in the same rank into an exhaust plenum 2806. The plenum also captures exhaust flow from the second depositor rank exhaust apertures through a local exhaust via 2807. Exhaust plenums may be connected to common exhaust channels 2808. Common exhaust channels may widen or merge further downstream.

FIG. 28A shows an example channel arrangement for a second depositor rank according to an embodiment disclosed herein, which may be used in conjunction with the first rank arrangement shown in FIG. 28A. In this arrangement, the delivery aperture is connected to a delivery plenum 2809 that also distributes delivery flow to the first depositor rank through a local delivery via. A common delivery channel 2810 is positioned upstream of the delivery plenum. Exhaust apertures from adjacent depositors are connected to local exhaust vias by local exhaust channels. A local exhaust via connects to the exhaust plenum in the first depositor rank.

EXPERIMENTAL

Depositors were modeled using COMSOL Multiphysics 5.3 using laminar flow, heat transfer, and species mixing modules. The chamber ambient surrounding the depositor was assumed to be argon at an absolute pressure of 200 Torr, while the gas introduced through the delivery aperture was helium. The depositor temperature was 350 C. Organic vapor was treated as a dilute gas entrained in the delivery flow.

The dimensions of the depositors with flared delivery apertures were: D=15 µm; E=25 µm; DE1=20 µm; θ=45°; DE2=60 µm; and g=30 µm unless otherwise specified, with each dimension corresponding to the definitions previously described herein. The flow through the delivery aperture (QD) was 6 sccm and the flow through the exhaust aperture (QE) was 24 sccm.

The dimensions of the trapezoidal delivery apertures were: D=15 µm; E=25 µm; DE1=20 µm; and DE2=65 µm or 75 µm. All aperture and spacer dimensions are measured along the centerline depositor as previously disclosed. The flow rates QD and QE were 4.5 sccm and 18 sccm, respectively. The length of each half of the delivery aperture was 190 µm and the length of each exhaust aperture was 450 µm for both the flared and trapezoidal depositors.

The delivery apertures of the two-rank depositors were 13×400 µm and the exhaust apertures were 15×450 µm. The fly height g was 30 µm. The QD and QE flows through each two-rank depositor were 12 sccm and 48 sccm, respectively.

A micronozzle array for trapezoidal architectures was fabricated by the method described in US Patent Pub. No. 2015/0376787. As previously disclosed herein, a DRIE process as described in the '787 patent publication may be tailored to generate a degree of undercut as it etches the channels downward. The undercut in the tested example corresponds to α=0.6°. The dimensions of the tested depositor were D=15 µm; E=25 µm; DE1=20 µm; DE2=75 µm. The depositor was operated in a 200 Torr argon ambient with a delivery flow of 6 sccm helium and an exhaust flow of 26 sccm. The depositor was heated to 350 C. The fly height separation between the substrate and depositor was 45 µm.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device for deposition of a material onto a substrate, the device comprising:
    a nozzle block comprising a first depositor comprising:
        a leading first rank comprising:
            a leading portion of a first exhaust aperture;
            a leading portion of a second exhaust aperture; and
            a first delivery aperture disposed between the leading portion of the first exhaust aperture and the leading portion of the second exhaust aperture;
            wherein a shortest distance from the first delivery aperture to the leading portion of the first exhaust aperture is less than a shortest distance from the first delivery aperture to the leading portion of the second exhaust aperture;
        a trailing second rank comprising:
            a trailing portion of the first exhaust aperture;
            a trailing portion of the second exhaust aperture; and
            a second delivery aperture disposed between the trailing portion of the first exhaust aperture and the trailing portion of the second exhaust aperture;
            wherein a shortest distance from the second delivery aperture to the trailing portion of the second exhaust aperture is less than a shortest distance from the second delivery aperture to the trailing portion of the first exhaust aperture;
        wherein the leading portion of the first exhaust aperture is separated from the trailing portion of the first exhaust aperture by a portion of the nozzle block; and
        wherein the leading portion of the second exhaust aperture is separated from the trailing portion of the second exhaust aperture by a portion of the nozzle block.

2. The device of claim 1, wherein the nozzle block comprises a plurality of depositors, each having a same arrangement of exhaust and delivery apertures as the first depositor.

3. The device of claim 1, wherein a center axis of the trailing portions of the first and second exhaust apertures is offset from a center axis of the leading portions of the first and second exhaust apertures by a distance φ, wherein φ>0.

4. The device of claim 3, wherein φ≤35 µm.

5. The device of claim 1, wherein the first delivery aperture has a flare width of 6-12 µm.

6. The device of claim 5, wherein the second delivery aperture has a flare width of 6-12 µm.

7. The device of claim 1, wherein, for any line drawn between and perpendicular to the leading portion of the first exhaust aperture and the leading portion of the second exhaust aperture, the line crosses only the first delivery aperture and not the second delivery aperture.

8. The device of claim 7, wherein, for any line drawn between and perpendicular to the trailing portion of the first exhaust aperture and the trailing portion of the second exhaust aperture, the line crosses only the second delivery aperture and not the first delivery aperture.

9. The device of claim 1, further comprising an external vacuum source in fluid communication with the first exhaust aperture and the second exhaust aperture.

10. The device of claim 1, wherein the first delivery aperture is trapezoidal.

11. The device of claim 10, wherein each portion of the first exhaust aperture and the second exhaust aperture is rectangular, and the longest edge of each portion of the first exhaust aperture and the second exhaust aperture is arranged along a direction of relative movement of the device and the substrate when the device is in operation.

12. The device of claim 10, wherein the second delivery aperture is trapezoidal.

13. The device of claim 10, wherein the first delivery aperture has an angle α between a long center axis of the first delivery aperture and a longest edge of the first delivery aperture, such that $1.1° \leq \alpha \leq 1.7°$.

14. The device of claim 13, wherein the second delivery aperture has an angle θ between a long center axis of the second delivery aperture and a longest edge of the second delivery aperture, such that $1.1° \leq \theta \leq 1.7°$.

15. The device of claim 1, further comprising a first delivery channel extending at least partially through the nozzle block and having a first end that forms the first delivery aperture;

wherein the first delivery channel is wider at a first portion of the first delivery channel than at a second portion of the first delivery channel, the first portion of the first delivery channel being closer to the first delivery aperture than the second portion of the first delivery channel, and wherein the first portion of the first delivery channel is in direct fluid communication with the first delivery aperture and the second portion of the first delivery channel is in direct fluid communication with the first portion of the first delivery channel.

16. The device of claim 15, further comprising a second delivery channel extending at least partially through the nozzle block and having a first end that forms the second delivery aperture;

wherein the second delivery channel is wider at a first portion than at a second portion, the first portion of the second delivery channel being closer to the second delivery aperture than the second portion of the second delivery channel, and wherein the first portion of the second delivery channel is in direct fluid communication with the second delivery aperture and the second portion of the second delivery channel is in direct fluid communication with the first portion of the second delivery channel.

17. The device of claim 15, wherein a side wall of the first portion of the first delivery channel forms an angle of 30-60° with the surface of the nozzle block.

* * * * *